United States Patent
Kang et al.

(10) Patent No.: US 11,581,025 B2
(45) Date of Patent: Feb. 14, 2023

(54) HIGH RESOLUTION ZQ CALIBRATION METHOD USING HIDDEN LEAST SIGNIFICANT BIT (HLSB)

(71) Applicant: SAMSUNG ELECTRONICS CO., LTD., Suwon-si (KR)

(72) Inventors: Hyunsuk Kang, Seoul (KR); Jungjune Park, Seoul (KR); Kyoungtae Kang, Seoul (KR); Junha Lee, Seoul (KR); Byunghoon Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 37 days.

(21) Appl. No.: 17/346,853

(22) Filed: Jun. 14, 2021

(65) Prior Publication Data
US 2022/0115046 A1  Apr. 14, 2022

(30) Foreign Application Priority Data

Oct. 14, 2020 (KR) .................. 10-2020-0132977

(51) Int. Cl.
*G11C 5/14* (2006.01)
*G11C 7/10* (2006.01)

(52) U.S. Cl.
CPC ............ *G11C 5/147* (2013.01); *G11C 7/1006* (2013.01); *G11C 7/1048* (2013.01)

(58) Field of Classification Search
CPC .................................. G11C 5/14; G11C 5/147
USPC ..................................................... 365/189.09
See application file for complete search history.

(56) References Cited

U.S. PATENT DOCUMENTS

| | | | |
|---|---|---|---|
| 7,548,086 B2 | 6/2009 | Kim et al. | |
| 7,902,858 B2 | 3/2011 | Kuwahara et al. | |
| 8,344,751 B2 | 1/2013 | Cho | |
| 8,766,664 B2* | 7/2014 | Yokou | G11C 11/4076 326/30 |
| 10,276,220 B2 | 4/2019 | Jeon et al. | |
| 2006/0158198 A1* | 7/2006 | Fujisawa | G11C 11/4093 324/601 |
| 2007/0057380 A1* | 3/2007 | Katagiri | H05K 3/0005 257/778 |
| 2007/0200591 A1 | 8/2007 | Kim | |

(Continued)

FOREIGN PATENT DOCUMENTS

| | | |
|---|---|---|
| KR | 10-0945813 B1 | 3/2010 |
| KR | 10-1138834 B1 | 5/2012 |
| KR | 10-2018-0062809 A | 6/2018 |

OTHER PUBLICATIONS

Chang-Kyo Lee et al.,"Dual-Loop 2-step ZQ Calibration for Dedicated Power Supply Voltage in LPDDR4 SDRAM",IEEE Asian Solid-State Circuits Conference,Nov. 2017,pp. 153-156,4 pages total.*

*Primary Examiner* — Muna A Techane
(74) *Attorney, Agent, or Firm* — Sughrue Mion, PLLC

(57) ABSTRACT

A high resolution impedance adjustment (ZQ) calibration method using a hidden least significant bit (HLSB) is provided. The high resolution ZQ calibration method generates a data input/output (DQ) code of n+1 bits without a calibration time increase by adding the hidden least significant bit (HLSB) to a ZQ code of n bits output in a ZQ calibration operation of an impedance adjustment (ZQ) pad. A change in a termination resistance of the DQ pad is reduced as small as possible by the DQ code of n+1 bits.

20 Claims, 16 Drawing Sheets

(56) References Cited

U.S. PATENT DOCUMENTS

2010/0036634 A1    2/2010   Byeon
2014/0266299 A1    9/2014   Seol et al.
2020/0059232 A1    2/2020   Johnson

* cited by examiner

FIG. 6

| CMPO | Code | Code bit | | | | |
|---|---|---|---|---|---|---|
| | | [3] | [2] | [1] | [0] | [HLSB] |
| H | ZQ[3:0] | 1 | 0 | 1 | 0 | – |
| | ZQ[3:0],[HLSB] | 1 | 0 | 1 | 0 | 0 |
| | DQC[3:0],[HLSB] | 1 | 0 | 1 | 0 | 1 |
| L | ZQ[3:0] | 1 | 0 | 1 | 1 | – |
| | ZQ[3:0],[HLSB] | 1 | 0 | 1 | 1 | 0 |
| | DQC[3:0],[HLSB] | 1 | 0 | 1 | 0 | 1 |

HLSB +1

HLSB −1

FIG. 10

| Code | Code sequence | Code bit | | | | |
|---|---|---|---|---|---|---|
| | | [3] | [2] | [1] | [0] | [HLSB] |
| ZQ[3:0] | K | 1 | 0 | 1 | 0 | - |
| | K-1 | 1 | 0 | 1 | 1 | - |
| | K-2 | 1 | 1 | 0 | 0 | - |
| | K-3 | 1 | 0 | 1 | 1 | - |
| DQC[3:0],[HLSB] | | 1 | 0 | 1 | 1 | 1 |

Average

HIGH RESOLUTION ZQ CALIBRATION METHOD USING HIDDEN LEAST SIGNIFICANT BIT (HLSB)

CROSS-REFERENCE TO THE RELATED APPLICATION

This application is based on and claims priority under 35 U.S.C. § 119 to Korean Patent Application No. 10-2020-0132977, filed on Oct. 14, 2020, in the Korean Intellectual Property Office, the disclosure of which is incorporated by reference herein in its entirety.

BACKGROUND

Example embodiments of the disclosure relate to a semiconductor integration circuit, and more particularly, to a high resolution impedance adjustment (ZQ) calibration method using a hidden least significant bit (HLSB) without a calibration time increase and a memory device employing the same.

Electronic devices include a plurality of semiconductor integrated circuits (or semiconductor chips), which make hardware configurations complex. In accordance with the demand for miniaturization and lightweight of electronic devices, a multi-chip package in which a plurality of semiconductor chips are mounted in one package is provided to reduce the number of mounted parts. In addition, to minimize the transmission time of signals interfaced between semiconductor chips, a swing width of signals decreases. As the swing width of signals decreases, semiconductor chips have a greater influence on external noise, and a signal reflection caused by an impedance mismatch in an interface becomes significant. To solve the impedance mismatch, semiconductor chips include a ZQ pin and receive a ZQ calibration command from the outside to perform a ZQ calibration operation, thereby controlling impedance matching.

In accordance with the trend of demand for high-capacity memory, a multi-chip package in which a plurality of memory chips (or dies) independently operating through different channels are mounted in one package is provided. In a multi-chip package channel, each of the memory chips performs a ZQ calibration operation on signal lines that transmit commands, addresses, and data of the corresponding memory chip. In this case, the ZQ calibration operation needs to be performed as much as the number of memory chips mounted on the multi-chip package. For example, if eight memory chips are mounted in a multi-chip package, eight ZQ calibration operations need to be performed, and the multi-chip package needs to complete the ZQ calibration operation during a ZQ calibration time specified in the package specification.

In addition, as an operation speed of the multi-chip package increases, data transmitted to the memory chips of the multi-chip package has a data eye diagram state. The data eye diagram shows an overlap of multiple data transitions representing jitter due to noise, which may appear as a waveform distorted by an environment of a signal line or a channel through which data is transmitted.

Accordingly, signal integrity (SI) of data transmitted to the memory chips of the multi-chip package is important. The SI characteristic of data is affected by a termination resistance change determined by a data driver, and it is desirable to reduce the termination resistance change.

When data is transmitted to the memory chips of the multi-chip package, if a precise calibration resolution is provided to reduce the termination resistance change of the data, a state in which an eye opening area of the data eye diagram is symmetric and the maximum eye may be found, which will be beneficial to improve the data SI characteristics.

SUMMARY

Example embodiments of the disclosure provide a high resolution impedance adjustment (ZQ) calibration method capable of reducing a termination resistance change of data by using a hidden least significant bit (HLSB) without increasing a calibration time and a multi-chip package employing the same.

According to an aspect of some example embodiments, there is provided a impedance adjustment (ZQ) calibration method including performing a ZQ calibration operation of a ZQ pad, to which a ZQ resistor is electrically connected, to generate a ZQ code of n (n being a natural number) bits, the ZQ code comprising a first bit that is a least significant bit (LSB) through an n-th bit that is a most significant bit (MSB); converting the ZQ code of n bits into a data input/output (DQ) code of n+1 bits, by adding a 0-th hidden least significant bit (HLSB) to the ZQ code of n bits to generate a coupled ZQ code of n+1 bits and generating the DQ code of n+1 bits based on the coupled ZQ code, the DQ code comprising an MSB, an LSB, and HLSB; and controlling a termination resistance value of a DQ pad based on the DQ code.

According to another aspect of some example embodiments, there is provided a memory device including a impedance adjustment (ZQ) calibration circuit electrically connected to a ZQ pad and configured to perform a ZQ calibration operation using a ZQ resistor electrically connected to the ZQ pad and generate a ZQ code of n (n being a natural number) bits, the ZQ code comprising a first bit that is a least significant bit (LSB) through an n-th bit that is a most significant bit (MSB); a code conversion circuit configured to convert the ZQ code of n bits into a data input/output (DQ) code of n+1 bits, by adding a 0-th hidden least significant bit (HLSB) to the ZQ code of n bits to generate a coupled ZQ code of n+1 bits, and generating the DQ code based on the coupled ZQ code, the DQ code comprising an MSB, an LSB, and an HLSB; and a DQ driver circuit configured to control a termination resistance value of a DQ pad based on the DQ code.

According to another aspect of some example embodiments, there is provided a multi-chip package including a printed circuit board; and a plurality of memory chips stacked on the printed circuit board and comprising an impedance adjustment (ZQ) pad and data input/output (DQ) pads, wherein each of the plurality of memory chips comprises: a ZQ calibration circuit electrically connected to the ZQ pad and configured to perform a ZQ calibration operation using a ZQ resistor outside the multi-chip package electrically connected to the ZQ pad and generate a ZQ code of n (n being a natural number) bits, the ZQ code comprising a first bit that is a least significant bit (LSB) through an n-th bit that is a most significant bit (MSB); a code conversion circuit configured to convert the ZQ code of n bits into a DQ code of n+1 bits, by adding a 0-th hidden least significant bit (HLSB) to the ZQ code of n bits to generate a coupled ZQ code of n+1 bits, and generating the DQ code based on the coupled ZQ code, the DQ code comprising an MSB, an LSB, and an HLSB; and a DQ driver circuit configured to control termination resistance values of the DQ pads based on the DQ code.

BRIEF DESCRIPTION OF THE DRAWINGS

The above and other aspects will become apparent by describing in detail example embodiments with reference to the accompanying drawings, in which:

FIG. 6 is a chart illustrating a high resolution ZQ calibration method according to example embodiments of the disclosure;

FIG. 10 is a chart illustrating a high resolution ZQ calibration method according to example embodiments of the disclosure;

DETAILED DESCRIPTION

Figure 1:
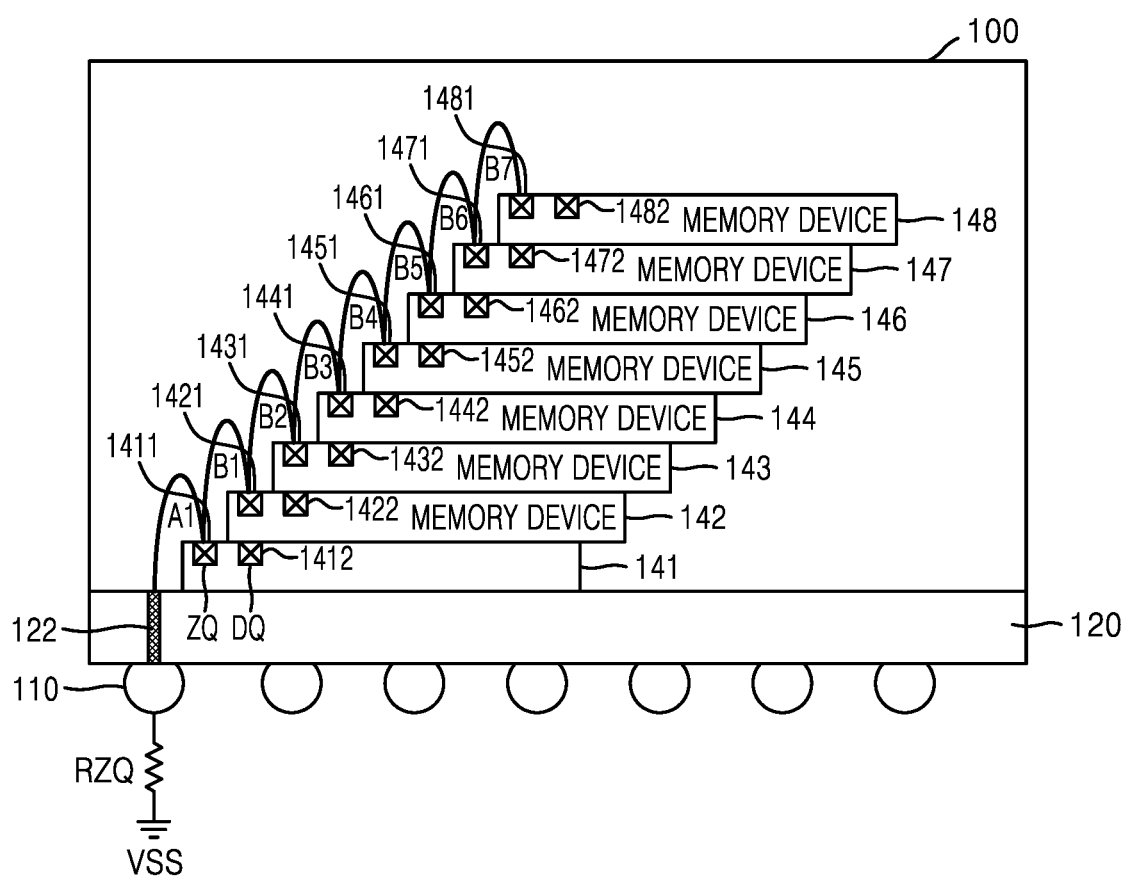
FIG. 1 is a diagram illustrating a multi-chip package to which a high resolution impedance adjustment (ZQ) calibration method according to example embodiments of the disclosure is applied.

Hereinafter, example embodiments will be described with reference to the accompanying drawings.

In the following description, like drawing reference numerals are used for like elements, even in different drawings. The matters defined in the description, such as detailed construction and elements, are provided to assist in a comprehensive understanding of the example embodiments. However, it is apparent that the example embodiments can be practiced without those specifically defined matters. Also, well-known functions or constructions are not described in detail since they would obscure the description with unnecessary detail.

Although terms of "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the right according to the concept of the present disclosure.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout.

As used herein, the singular forms are intended to include the plural forms as well, unless the context clearly indicates otherwise. It should be further understood that the terms "comprises," "comprising," "includes," and/or "including," when used in this specification, specify the presence of stated features, integers, steps, operations, elements, components or a combination thereof, but do not preclude the presence or addition of one or more other features, integers, steps, operations, elements, components, and/or groups thereof. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a diagram illustrating a multi-chip package 100 to which a high resolution impedance adjustment (ZQ) calibration method according to example embodiments of the disclosure is applied.

Referring to FIG. 1, the multi-chip package 100 includes a plurality of memory devices 141 to 148 stacked on a printed circuit board 120. The printed circuit board 120 may include a plurality of conductive layers and through electrodes (e.g., through-silicon vias; TSVs) 122 separated by an insulating layer therein. The conductive layers and the through electrodes 122 of the printed circuit board 120 may be connected to external terminals 110 of the multi-chip package 100. For example, the external terminals 110 of the multi-chip package 100 may be package balls or leads.

Some examples may be described using the expressions "connected" and "coupled" along with their derivatives. These terms are not necessarily intended as synonyms for each other. For example, a description using the terms "connected" and/or "coupled" may refer to two or more elements in direct physical or electrical contact with each other. Further, the terms "connecting" and/or "coupling" may also mean that two or more elements are not in direct contact with each other but still cooperate or interact with each other.

The multi-chip package 100 may be implemented as, for example, PoP (Package On Package), BGA (Ball Grid Arrays), CSP (Chip Scale Package), PLCC (Plastic Leaded Chip Carrier), PDIP (Plastic Dual In-line Package), Die in Waffle Pack, Die in Wafer Form, COB (Chip On Board), CERDIP (CERamic Dual In-line Package), MQFP (Metric Quad Flat Package), TQFP (Thin Quad FlatPack), Small Outline (SOIC), SSOP (Shrink Small Outline Package), TSOP (Thin Small Outline), SIP (System In Package), MCP (Multi Chip Package), WFP (Wafer-level Fabricated Package), WSP (Wafer-level processed Stack Package), etc.

The multi-chip package 100 may be a memory system that provides high capacity and high speed memory devices. The memory devices 141 to 148 may include nonvolatile memory devices. Nonvolatile memory devices, as a non-limiting example, may include a flash memory, a PRAM (Phase Change Random Access Memory), an RRAM (Resistance Random Access Memory), an MRAM (Magnetic Random Access Memory), FRAM (Ferroelectric Random Access Memory), an EEPROM (non-volatile memory such as an Electrically Erasable Programmable Read-Only Memory), an NFGM (Nano Floating Gate Memory), a PoRAM (Polymer Random Access Memory), etc. In some example embodiments, the multi-chip package 100 may include a solid state drive (SSD), an embedded UFS (Universal Flash Storage) memory card, an eMMC (embedded Multi-Media Card), a CF (Compact Flash), an SD (Secure Digital), a Micro-SD (Micro Secure Digital), a Mini-SD (Mini Secure Digital), an xD (extreme Digital) or a memory stick including nonvolatile memory devices and a buffer chip (or a memory controller) that controls the nonvolatile memory devices.

According to an example embodiment, the memory devices 141 to 148 may include a plurality of volatile memory devices. Volatile memory devices, as a non-limiting example, may include a DRAM (Dynamic Random Access Memory), an SRAM (Static Random Access Memory), a mobile DRAM, a DDR SDRAM (Double Data Rate Synchronous Dynamic Random Access Memory), an LPDDR (Low Power DDR) SDRAM, a GDDR (Graphic DDR) SDRAM, an RDRAM (Rambus Dynamic Random Access Memory), etc. In some example embodiments, the multi-chip package 100 may be a DRAM Multi-Chip Package (MCP) or a High Bandwidth Memory (HBM).

According to an example embodiment, the memory devices 141 to 148 may include heterogeneous memory devices including nonvolatile memory devices and volatile memory devices. Hereinafter, the memory devices 141 to 148 are described as a NAND flash memory, but it will be appreciated that the disclosure is not limited thereto.

The memory devices 141 to 148 may be configured as the NAND flash memory. The NAND flash memory includes a memory cell array including memory cells arranged in rows (word lines) and columns (bit lines). Each memory cell may operate in one of a single-level cell (SLC) mode, a multi-level cell (MLC) mode, a triple-level cell (TLC) mode, and a quad-level cell (QLC) mode according to the control of a memory controller. Each memory cell may be implemented as a memory cell including a charge storage layer such as a floating gate or a charge trap layer, or a memory cell including a variable resistance element.

The memory cell array may be implemented to have a single-layer array structure (or a two-dimensional array structure) or a multi-layer array structure (or a three-dimensional (3D) array structure). A 3D memory array is monolithically formed on at least one physical level of memory cell arrays including an active region disposed on a silicon substrate and a circuit formed on or in the substrate as a circuit related to operations of the memory cells. The term "monolithic" means that layers of each level constituting the array are stacked directly above the layers of each lower level of the array.

In an example embodiment according to the disclosure, the 3D memory array includes cell strings arranged in a vertical direction such that at least one memory cell is located on or above another memory cell. The at least one memory cell may include a charge trap layer. U.S. Pat. Nos. 7,679,133, 8,553,466, 8,654,587, and 8,559,235, and U.S. Patent Application Publication No. 2011/0233648 disclose configurations of a 3D memory array including a plurality of levels and sharing word lines and/or bit lines between the levels, and are incorporated herein by reference. In addition, U.S. Patent Application Publication No. 2014-0334232 and U.S. Pat. No. 8,488,381 are incorporated herein by reference.

In another example embodiment according to the disclosure, the 3D memory array may have a cell over peri (COP) structure. The COP structure refers to a structure in which memory cell structures are stacked on a peripheral circuit, and the memory cell structure may include a channel extending in a direction perpendicular to an upper surface of a silicon substrate. U.S. Pat. Nos. 9,666,289 and 9,548,316 disclose configurations for the COP structure, which are incorporated herein by reference.

The multi-chip package 100 may be mounted on, for example, an SSD. The SSD may include a plurality of independent interfaces called channels. A plurality of flash memory devices may be connected to one channel, and the number of flash memory devices connected to one channel may be defined as a way or a bank. The multi-chip package 100 may operate as one channel of an SSD, and the plurality of memory devices 141 to 148 may include banks.

The memory devices 141 to 148 may be connected to each other through bonding wires B1 to B7. For example, the first memory device 141 may be connected to the second memory device 142 through the bonding wire B1. The second memory device 142 may be connected to the third memory device 143 through the bonding wire B2. The third memory device 143 may be connected to the fourth memory device 144 through the bonding wire B3. The fourth memory device 144 may be connected to the fifth memory device 145 through the bonding wire B4. The fifth memory device 145 may be connected to the sixth memory device 146 through the bonding wire B5. The sixth memory device 146 may be connected to the seventh memory device 147 through the bonding wire B6. The seventh memory device 147 may be connected to the eighth memory device 148 through the bonding wire B7. In an example embodiment of FIG. 1, it is described that the multi-chip package 100 includes eight memory devices, but this is exemplary and the disclosure is not limited thereto.

The first to eighth memory devices 141 to 148 may respectively include a plurality of input/output pads. The plurality of input/output pads may include data input/output pads (hereinafter referred to as "DQ pads"), impedance adjustment pads (hereinafter referred to as "ZQ pads"), command pads, and address pads. In FIG. 1, for conceptual description of the disclosure and simplification of the drawings, the first to eighth memory devices 141 to 148 respectively include ZQ pads 1411, 1421, 1431, 1441, 1451, 1461, 1471, and 1481 and DQ pads 1412, 1422, 1432, 1442, 1452, 1462, 1472, and 1482, and the ZQ pads 1411, 1421, 1431, 1441, 1451, 1461, 1471, and 1481 are disposed adjacent to one edge of the first to eighth memory devices 141 to 148 and are connected to each other by the bonding wires B1 to B7. The first to eighth memory devices 141 to 148 may be stacked in a shape of stairs so that the ZQ pads 1411, 1421, 1431, 1441, 1451, 1461, 1471, and 1481 are exposed for bonding wiring.

In an example embodiment, the term "pad" broadly refers to an electrical interconnection to an integrated circuit, and may include, for example, a pin or another electrical contact on the integrated circuit.

The first memory device 141 may be disposed lowermost among the memory devices 141 to 148, which are stacked, and connected to the conductive layers and the through electrodes 122 of the printed circuit board 120 to be coupled to the external terminals 110 of the multi-chip package 100. The ZQ pad 1411 of the first memory device 141 may be connected to the conductive layer and the through electrode 122 of the printed circuit board 120 through the bonding wire A1, and may be coupled to the external terminals 110 of the multi-chip package 100. The external terminal 110 connected to the ZQ pad 1411 may hereinafter be referred to as the ZQ terminal 110. An external resistor RZQ may be connected between the ZQ terminal 110 and a ground voltage VSS. A value of the external resistor RZQ may be, for example, about 300Ω.

The high resolution ZQ calibration method may be performed by each of the memory devices 141 to 148. The high resolution ZQ calibration method performs a ZQ calibration operation of the ZQ pads 1411, 1421, 1431, 1441, 1451, 1461, 1471, and 1481 to generate a ZQ code of n bits, adds a hidden least significant bit (HLSB) to the ZQ code of n bits to convert the ZQ code of n bits into a DQ code of n+1 bits without increasing a calibration time, and controls termination resistance values of the DQ pads 1412, 1422, 1432, 1442, 1452, 1462, 1472, and 1482 by using the DQ code of n+1 bits. Accordingly, a termination resistance change of the DQ pads 1412, 1422, 1432, 1442, 1452, 1462, 1472, and 1482 may be reduced as small as possible. The HLSB is a bit that is not used for the ZQ calibration operation of the ZQ pads 1411, 1421, 1431, 1441, 1451, 1461, 1471, and 1481, and is the least significant bit (LSB).

Hereinafter, a high resolution ZQ calibration method according to an example embodiment will be described in detail by using an example of the first memory device 141 among the memory devices 141 to 148. In the following example embodiments, the terms "the first memory device 141" and "the memory device" may be used interchangeably, and subscripts (e.g., a of 141a and b of 141b) of reference numerals are used to identify a plurality of circuits of the same function. It would be understood that the high resolution ZQ calibration method according to an example embodiment may be performed by any one of the memory devices 142 to 148 other than the memory device 141.

Figure 2:
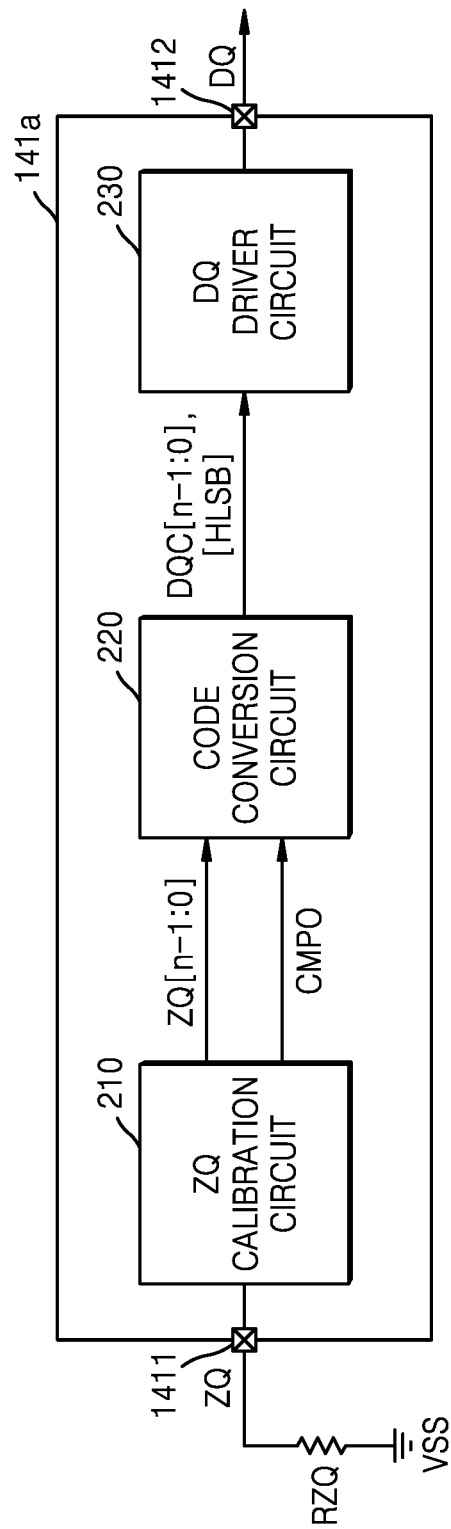
FIG. 2 is a diagram illustrating a memory device that performs a high resolution ZQ calibration method according to example embodiments of the disclosure.

FIG. 2 is a diagram illustrating a memory device 141a that performs a high resolution ZQ calibration method according to example embodiments of the disclosure. FIG. 2 illustrates multiple conceptual hardware configurations included in the memory device 141a, but the memory device 141a is not limited thereto and other configurations are possible.

Referring to FIG. 2, the memory device 141a (as an example of the memory device 141 in FIG. 1) may include a ZQ calibration circuit 210 connected to the ZQ pad 1411, a code conversion circuit 220, and a DQ driver circuit 230 connected to the DQ pad 1412.

The ZQ calibration circuit 210 may generate a ZQ code ZQ[n−1:0] of n bits converged by repeatedly performing a calibration operation using the external resistor RZQ connected to the ZQ pad 1411. The ZQ calibration circuit 210 may compare a voltage level of the ZQ pad 1411 connected to the external resistor RZQ to a reference voltage level VREFQ during the calibration operation and output a comparison signal CMPO based on a result of comparison.

The code conversion circuit 220 may receive the ZQ code ZQ[n−1:0] of n bits output from the ZQ calibration circuit 210 and the comparison signal CMPO, convert the ZQ code ZQ[n−1:0] of n bits into a coupled ZQ code ZQ[n−1:0],[HLSB] of n+1 bits, and control the coupled ZQ code ZQ[n−1:0],[HLSB] based on the comparison signal CMPO to generate a DQ code DQC[n−1:0],[HLSB] of n+1 bits.

The DQ driver circuit 230 may determine a termination resistance value of the DQ pad 1412 based on the DQ code DQ[n−1:0],[HLSB] of n+1 bits.

Figure 3:
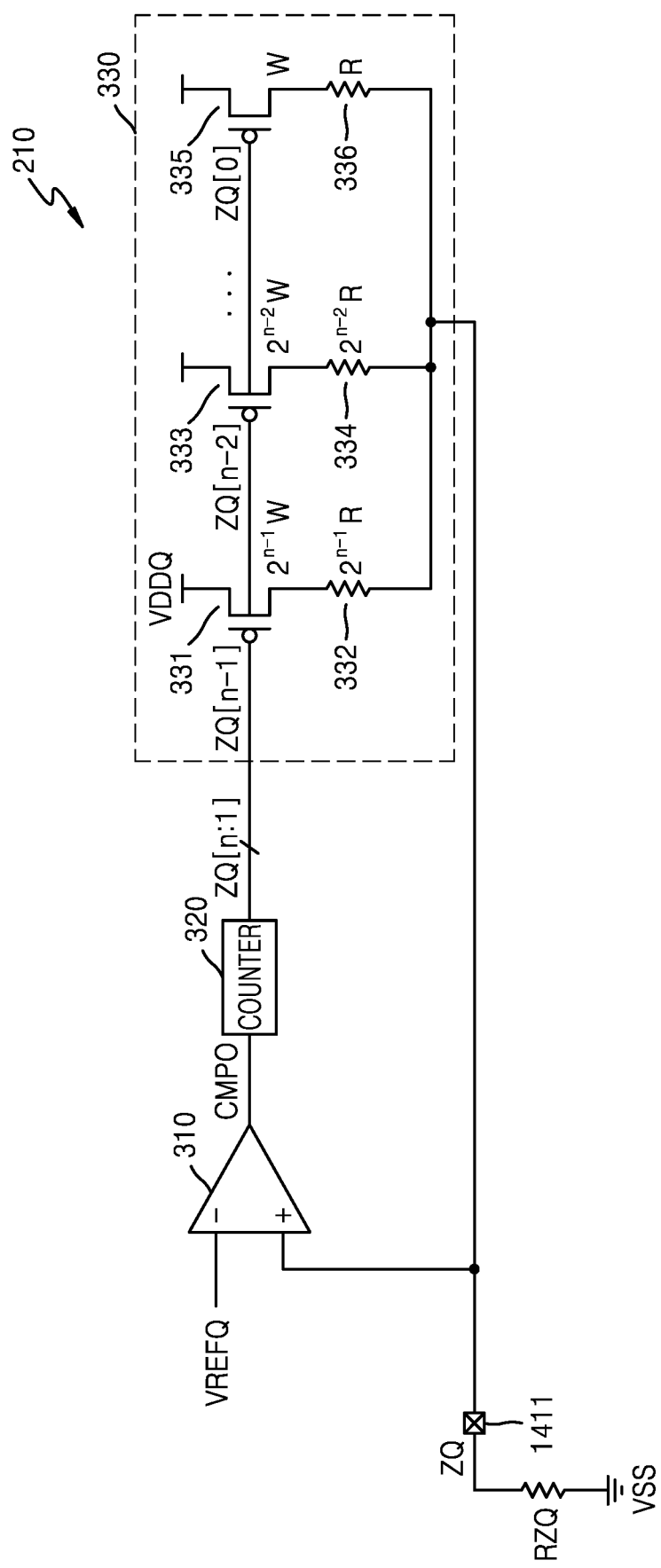
FIG. 3 is a circuit diagram illustrating a ZQ calibration circuit of FIG. 2.

FIG. 3 is a circuit diagram illustrating the ZQ calibration circuit 210 of FIG. 2.

Referring to FIG. 3, the ZQ calibration circuit 210 may repeatedly perform a calibration operation using the external resistor RZQ connected to the ZQ pad 1411, and as a result, generate the ZQ code ZQ[n−1:0] of n bits. The ZQ calibration circuit 210 may include a comparator 310, a counter 320, and a pull-up circuit unit (or a pull-up circuit) 330. In the following example embodiments, the terms "the pull-up circuit unit 330" and "pull-up" may be used interchangeably.

The pull-up circuit unit 330 may include PMOS transistors 331, 333, . . . and 335, of which gates each of the ZQ codes ZQ[n−1:0] is input, and resistors 332, 334, . . . and 336 respectively connected in series with the PMOS transistors 331, 333, . . . and 335 between a power voltage VDDQ and the ZQ pad 1411. A size ratio of the PMOS transistors 331, 333, . . . and 335 and/or a resistance value ratio of the resistors 332, 334, . . . and 336 may be set to different values according to a binary weight of the corresponding ZQ code ZQ[n−1:0].

For example, the size of the PMOS transistor 331 to which the ZQ code ZQ[n−1] is input may be set to a width of $2^{n-1}W$ or the resistor 332 may be set to a resistance value of $2^{n-1}R$. The size of the PMOS transistor 333 to which the ZQ code ZQ[n−2] is input may be set to a width of $2^{n-2}W$ or the resistor 334 may be set to a resistance value of $2^{n-2}R$. The size of the PMOS transistor 335 to which the ZQ code ZQ[0] is input may be set to $2^0 \times W$, that is, a width of W, or the resistor 336 may be set to $2^0 \times R$, that is, a resistance value of R. Here, W is expressed in a unit of a width of a transistor, and R is expressed in a unit of a resistance value of a resistor.

The comparator 310 may compare the voltage level of the ZQ pad 1411 connected to the external resistor RZQ with the reference voltage level VREFQ. The reference voltage level VREFQ may have a voltage level corresponding to half VDDQ/2 of the power voltage VDDQ. The comparator 310 may output a comparison signal CMPO by comparing the voltage level of the ZQ pad 1411 to the reference voltage VREFQ. The comparison signal CMPO may be provided to the counter 320 to increase or decrease a counting operation of the counter 320. The counter 320 may increase (or count up) or decrease (or count down) the ZQ code ZQ[n−1:0] by performing the counting operation based on the comparison signal CMPO.

For example, when the voltage level of the ZQ pad 1411 is higher than the reference voltage VREFQ level, the comparator 310 may output, for example, the comparison signal CMPO of a logic high level. The comparison signal CMPO of the logic high level may increase the ZQ code ZQ[n−1:0] by controlling the counter 320 to count up, reduce the number of PMOS transistors 331, 333, . . . and 335 that are turned on in the pull-up circuit unit 330, and reduce the number of resistors 332, 334, . . . and 336 connected between the power voltage VDDQ and the ZQ pad 1411. Due to a reduction in the number of resistors 332, 334, . . . and 336 in parallel connected in the pull-up circuit unit 330, the voltage level of the ZQ pad 1411 decreases as the resistance value of the pull-up circuit unit 330 increases. Such a calibration operation may be repeatedly performed until the voltage level of the ZQ pad 1411 decreases to be equal to the reference voltage VREFQ level.

When the voltage level of the ZQ pad 1411 is lower than the reference voltage VREFQ level, the comparator 310 may output, for example, the comparison signal CMPO of a logic low level. The comparison signal CMPO of the logic low level may reduce the ZQ code ZQ[n−1:0] by controlling the counter 320 to count down, increase the number of PMOS transistors 331, 333, . . . and 335 that are turned on in the pull-up circuit unit 330, and increase the number of resistors 332, 334, . . . and 336 connected between the power voltage VDDQ and the ZQ pad 1411. Due to an increase in the number of resistors 332, 334, . . . and 336 in parallel connected in the pull-up circuit unit 330, the voltage level of the ZQ pad 1411 increases as the resistance value of the pull-up circuit unit 330 decreases. Such a calibration operation may be repeatedly performed until the voltage level of the ZQ pad 1411 increases to be equal to the reference voltage VREFQ level.

The ZQ code ZQ[n−1:0] converged as a result of the calibration operation of the ZQ calibration circuit 210 may be generated and may be provided to the code conversion circuit 220.

Figure 4:
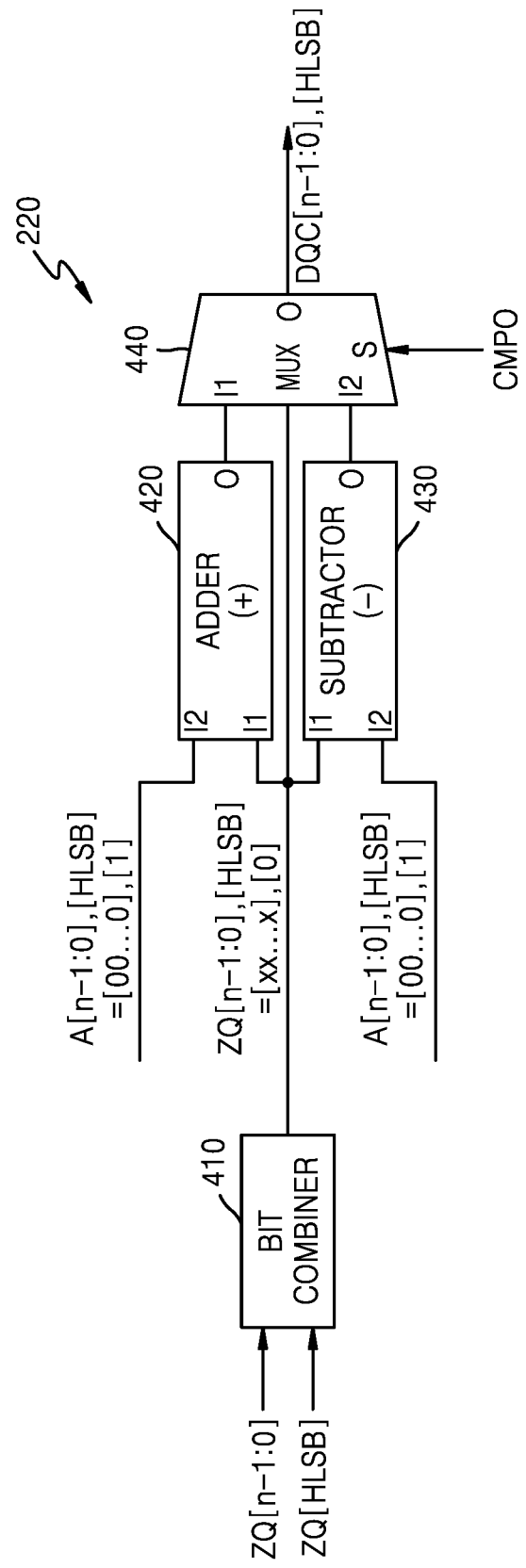
FIG. 4 is a circuit diagram illustrating a code conversion circuit of FIG. 2.

FIG. 4 is a circuit diagram illustrating the code conversion circuit 220 of FIG. 2.

Referring to FIG. 4, the code conversion circuit 220 may receive the ZQ code ZQ[n−1:0] of n bits and the comparison signal CMPO and convert the ZQ code ZQ[n−1:0] of n bits into the DQ code DQC[n−1:0],[HLSB]. The code conversion circuit 220 may include a bit coupler (or bit combiner) 410, an adder 420, a subtractor 430, and a selector 440.

The bit coupler 410 may couple a 0th ZQ code ZQ[HLSB] to a ZQ code ZQ[n−1:0] including a first bit ZQ[0] to an nth bit ZQ[n−1]. The coupled ZQ code ZQ[n−1:0], [HLSB] may include n+1 bits. For example, when the ZQ code ZQ[n−1:0] of n bits includes [xx . . . x], the ZQ[HLSB] code may be set to a bit of '0'. Each bit 'x' of the ZQ[n−1:0] code may be '0' or '1'. For convenience of explanation, in the coupled ZQ code ZQ[n−1:0],[HLSB], an LSB of the coupled ZQ code ZQ[n−1:0],[HLSB] is referred to as ZQ[0], and an HLSB of the coupled ZQ code ZQ[n−1:0],[HLSB] is referred to as ZQ[HLSB] code. The coupled ZQ code ZQ[n−1:0],[HLSB] [xx . . . x],[0] of n+1 bits may be provided to the adder 420 and the subtractor 430.

The adder 420 may include a first input I1 that receives the coupled ZQ code ZQ[n−1:0],[HLSB], a second input I2 that receives a first signal code A[n−1:0],[HLSB], and an output O. The first signal code A[n−1:0],[HLSB] may include n+1 bits in the same manner as the coupled ZQ code ZQ[n−1:0],[HLSB]. A first bit A[0] to an nth bit A[n−1] of the first signal code A[n−1:0],[HLSB] may be set to a '0' bit, and a 0th first signal code A[HLSB] may be set to a '1' bit. That is, the first signal code A[n−1:0],[HLSB] may be set to [00 . . . 0],[1]. The adder 420 may add, for each bit, the coupled ZQ code ZQ[n−1:0],[HLSB] [xx . . . x],[0] of n+1 bits and the first signal code A[n−1:0],[HLSB] [00 . . . 0], [1] of n+1 and output a result of the addition.

The subtractor 430 may include a first input I1 that receives the coupled ZQ code ZQ[n−1:0],[HLSB], a second input I2 that receives the first signal code A[n−1:0],[HLSB], and an output O. The subtractor 430 may subtract, for each bit, the first signal code A[n−1:0],[HLSB] [00 . . . 0], [1] of n+1 bits from the coupled ZQ code ZQ[n−1:0],[HLSB] [xx . . . x],[0] of n+1 bits and output a result of the subtraction.

The selector 440 may include a first input I1 connected to the output O of the adder 420, a second input I2 connected to the output O of the subtractor 430, a third input S that receives the comparison signal CMPO, and an output O. The output O of the selector 440 may output the DQ code DQ[n−1:0], [HLSB]. The selector 440 may be a multiplexer that selects one of the first input I1 and the second input I2 in response to the comparison signal CMPO of the third input S and outputs the DQ code DQ[n−1:0],[HLSB]. When the comparison signal CMPO has the logic high level, the selector 440 may select and output, via the output O of the selector 440, the output O of the adder 420 of the first input I1 as the DQ code DQ[n−1:0],[HLSB], and when the comparison signal CMPO has the logic low level, the selector 440 may select and output, via the output O of the selector 440, the output O of the subtractor 430 of the second input I2 as the DQ code DQ[n−1:0],[HLSB]. The DQ code DQ[n−1:0],[HLSB] may be provided to the DQ driver circuit 230.

Figure 5:
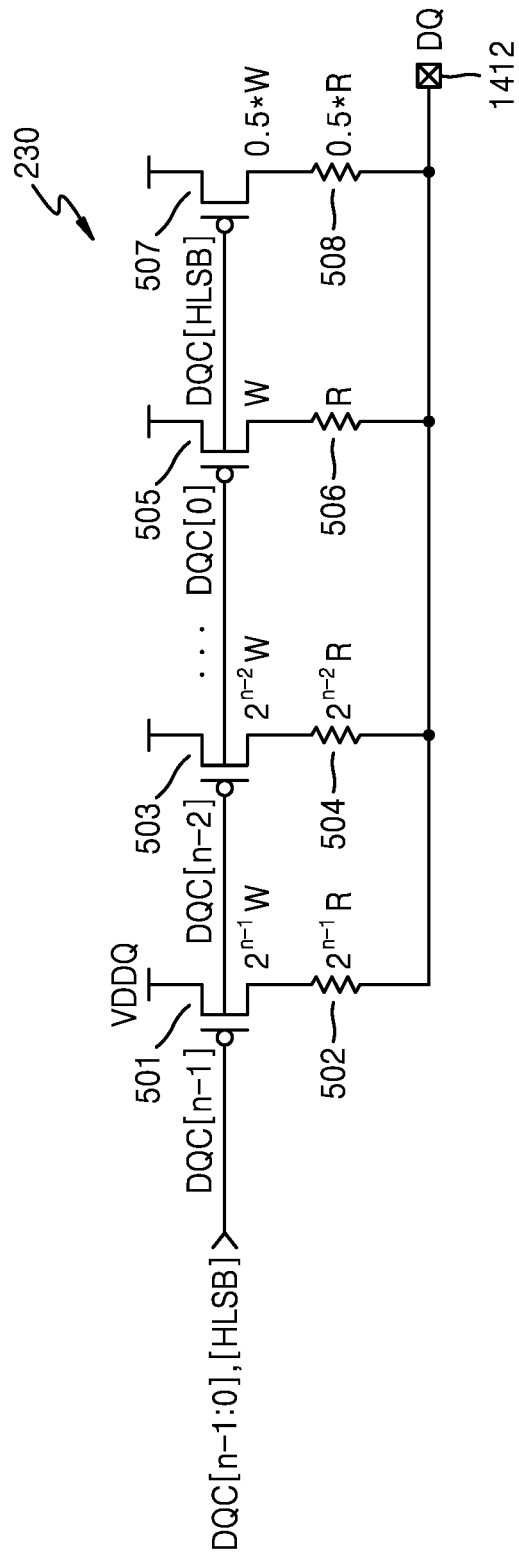
FIG. 5 is a circuit diagram illustrating a data input/output (DQ) driver circuit of FIG. 2.

FIG. 5 is a circuit diagram illustrating the DQ driver circuit 230 of FIG. 2.

Referring to FIG. 5, the DQ driver circuit 230 may control a termination resistance value of the DQ pad 1412 based on the DQ code DQ[n−1:0],[HLSB]. The DQ driver circuit 230 may include PMOS transistors 501, 503, . . . 505, and 507 of which gates each of the DQ codes DQ[n−1:0], [HLSB] is input, and resistors 502, 504, . . . 506, and 508 connected in series with the PMOS transistors 501, 503, . . . 505, and 507 between the power voltage VDDQ and the DQ pad 1412. A size ratio of the PMOS transistors 501, 503, . . . 505, and 507 and/or a resistance value ratio of the resistors 502, 504, . . . 506, and 508 may be set to different values according to a binary weight of the corresponding DQ code DQ[n−1:0], [HLSB].

For example, the size of the PMOS transistor 501 to which the DQ code DQ[n−1] is input may be set to a width of $2^{n-1}W$ or the resistor 502 may be set to a resistance value of $2^{n-1}R$. The size of the PMOS transistor 503 to which the DQ code DQ[n−2] is input may be set to a width of $2^{n-2}W$, or the resistor 504 may be set to a resistance value of $2^{n-2}R$. The size of the PMOS transistor 505 to which the DQ code DQ[0] is input may be set to $2^0 \times W$, that is, a width of W, or the resistor 506 may be set to $2^0 \times R$, that is, a resistance value of R. The size of the PMOS transistor 507 to which the DQ code DQ[HLSB] is input may be set to have a width of 0.5×W, or the resistor 504 may be set to have a resistance value of 0.5×R.

In the DQ driver circuit 230, the termination resistance value of the DQ pad 1412 may be determined by the resistors 502, 504, . . . 506, and 508 connected in series to each of the PMOS transistors 501, 503, . . . 505, and 507 turned on based on the DQ code DQ[n−1:0],[HLSB].

FIG. 6 is a chart illustrating a high resolution ZQ calibration method according to example embodiments of the disclosure.

Referring to FIG. 6 in connection with FIGS. 2 to 5, as a result of comparing a voltage level of the ZQ pad 1411 to the reference voltage VREFQ level in the ZQ calibration circuit 210, it is assumed that a ZQ code ZQ[3:0] of 4 bits is generated and the ZQ code ZQ[3:0] converges to [1010] or [1011].

In the ZQ calibration circuit 210, when the ZQ code ZQ[3:0] is output as [1010], the next ZQ code ZQ[3:0] increases to [1011], and thus, the comparison signal CMPO may be output in a logic high level. Alternatively, when the ZQ code ZQ[3:0] is output as [1011], the next ZQ code ZQ[3:0] is reduced to [1010], and thus, the comparison signal CMPO may be output in a logic low level.

The code conversion circuit 220 may convert the ZQ code ZQ[3:0] of 4 bits into a coupled ZQ code ZQ[3:0], [HLSB] of 5 bits and generate a DQ code DQC[3:0],[HLSB]. When the ZQ code ZQ[3:0] is output as [1010], the coupled ZQ code ZQ[3:0],[HLSB] may be output as [10100] by setting ZQ[HLSB] '0' to the ZQ code ZQ[3:0] [1010]. Based on the logic high level of the comparison signal CMPO, a '1' bit may be added to an HLSB of the coupled ZQ code ZQ[3:0],[HLSB] [10100], and thus, a DQ code DQC[3:0],[HLSB] [10101] may be output.

When the ZQ code ZQ[3:0] is output as [1011], the coupled ZQ code ZQ[3:0],[HLSB] may be output as [10110] by setting ZQ[HLSB] '0' to the ZQ code ZQ[3:0] [1011]. Based on the logic low level of the comparison signal CMPO, a '1' bit may be subtracted from an HLSB of the coupled ZQ code ZQ[3:0],[HLSB] [10110], and thus, a DQ code (DQC[3:0],[HLSB][10101] may be output.

Accordingly, regardless of whether the ZQ code ZQ[3:0] is output as [1010] or [1011], the code conversion circuit 220 operates in a manner such that the ZQ code ZQ[3:0] is consistently converted into the DQ code DQC[3:0],[HLSB] [10101]. That is, even if the ZQ code ZQ[3:0] fluctuates and converges to [1010] or [1011], the DQ code DQC[3:0],[HLSB] is locked to [10101], and thus, a termination resistance value of the DQ pad 1412 does not change. The calibration operation according to example embodiments outputs the ZQ code ZQ[3:0] of 4 bits and achieves the effect of performing a high resolution ZQ calibration operation corresponding to a ZQ code of 5 bits. Accordingly, the high resolution ZQ calibration operation may be performed without a calibration time increase, and the termination resistance value of the DQ pad 1412 may remain unchanged.

Figure 7:
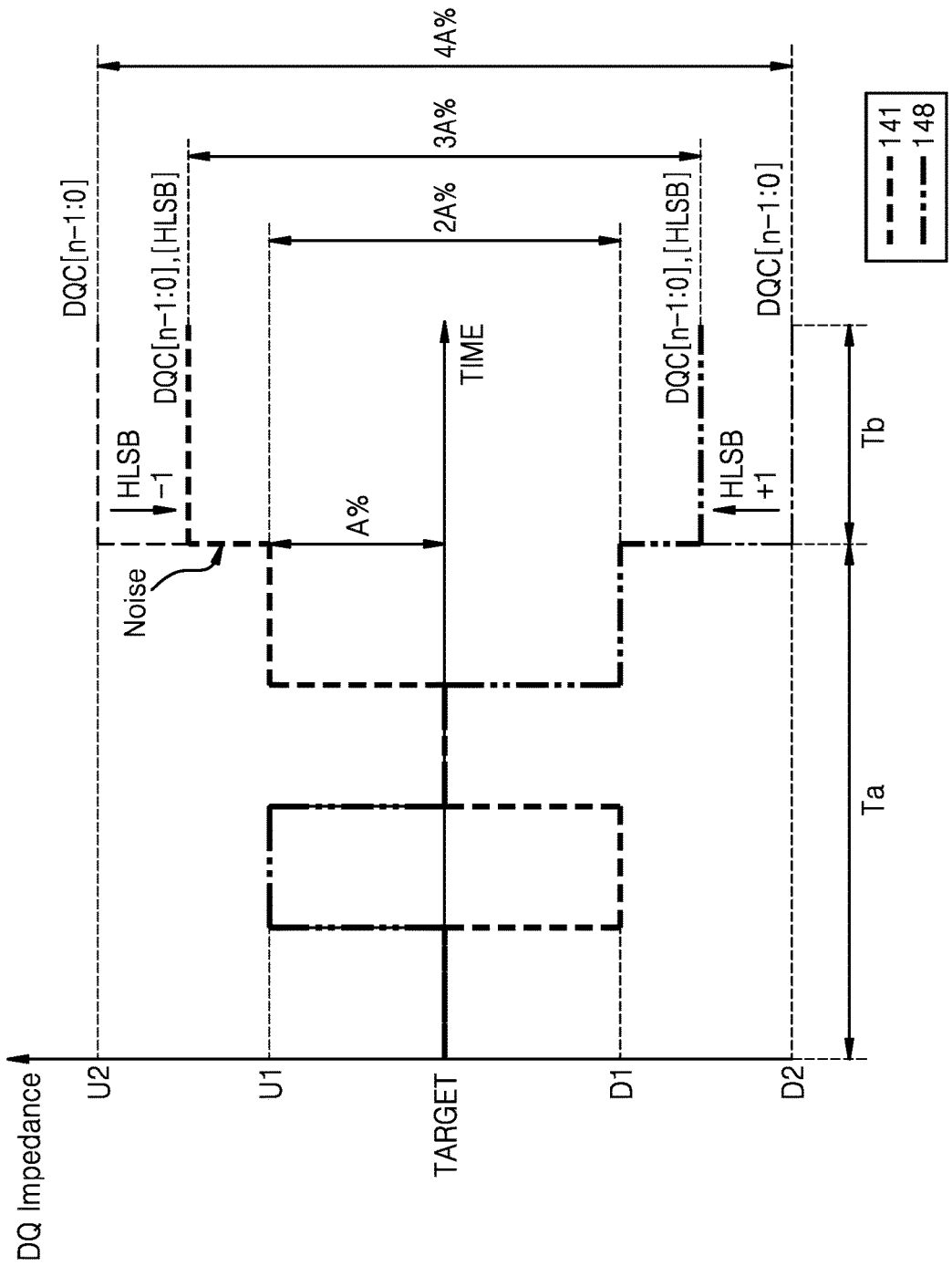
FIG. 7 is a diagram illustrating a method of changing a DQ code in a high resolution ZQ calibration method according to example embodiments of the disclosure.

FIG. 7 is a diagram illustrating a method of changing a DQ code in a high resolution ZQ calibration method according to example embodiments of the disclosure.

Referring to FIGS. 1 and 7, termination impedances of the DQ pads 1412 and 1418 obtained as a result of a high resolution ZQ calibration operation performed by each of the first memory device 141 and the eighth memory device 148 of the multi-chip package 100 are shown.

During a period Ta, the termination impedance of the DQ pad 1412 of the first memory device 141 converges while changing up to a first up value U1 with respect to a target value TARGET and the termination impedance of the DQ pad 1482 of the eighth memory device 148 converges while changing up to a first down value D1 with respect to the target value TARGET. In this regard, the termination impedances of the DQ pads 1412 and 1482 may have an overall change rate of about 2A %. A % is expressed in units of a change rate of termination resistance values of the DQ pads 1412 and 1482 according to the first up value U1 or the first down value D1 with respect to the target value TARGET.

During a period Tb, noise may be induced in an environment of channels of the first and eighth memory devices 141 and 148. Accordingly, the termination impedances of the DQ pads 1412 and 1482 of the first and eighth memory devices 141 and 148 may greatly change to a second up value U2 or a second down value D2. In this regard, the first memory device 141 may reduce the second up value U2 as low as an HLSB of the DQ code DQC[n–1:0],[HLSB] being subtracted by a '1' bit through the high resolution ZQ calibration operation. The eighth memory device 148 may also increase the second down value D2 as high as the HLSB of the DQ code DQC[n–1:0],[HLSB] being added by a '1' bit through the high resolution ZQ calibration operation. Accordingly, the termination resistance values of the DQ pads 1412 and 1482 of the first and eighth memory devices 141 and 148 due to noise may be reduced from an overall change rate of about 4A % to about 3A %. That is, the change rate of the termination resistance values may be reduced for signal integrity (SI) characteristics of data transmitted to the DQ pads 1412 and 1482 of the first and eighth memory devices 141 and 148 of the multi-chip package 100.

Figure 8:
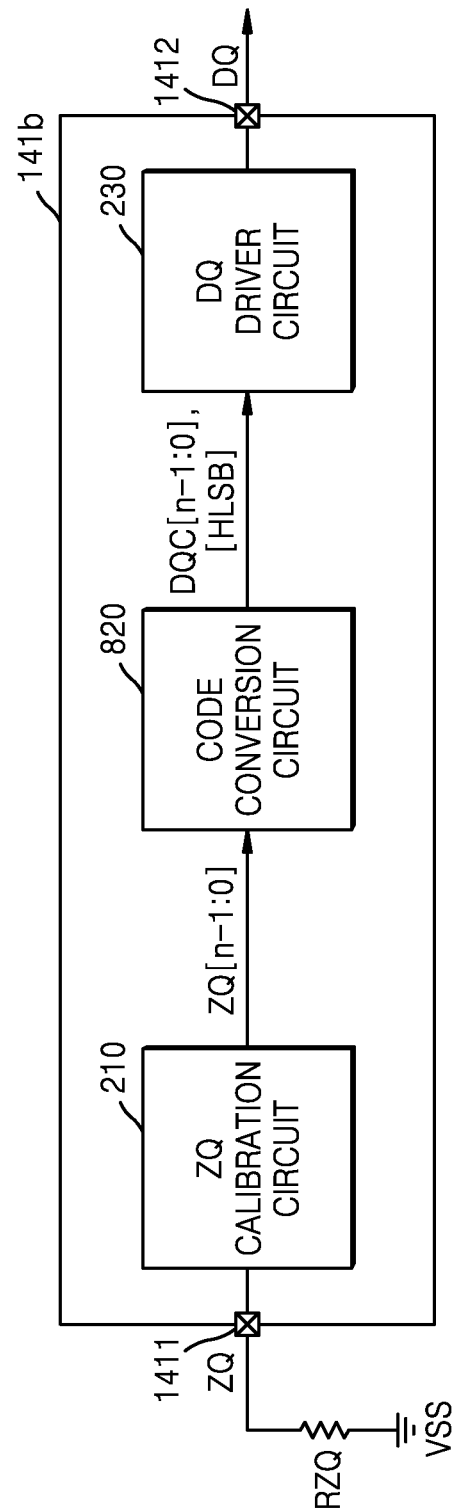
FIG. 8 is a diagram illustrating a memory device that performs a high resolution ZQ calibration method according to example embodiments of the disclosure.

FIG. 8 is a diagram illustrating a memory device 141b that performs a high resolution ZQ calibration method according to example embodiments of the disclosure. Compared with the memory device 141a illustrated in FIG. 2, the memory device 141b of FIG. 8 is different only with respect to a code conversion circuit 820 and the remaining components are the same. Hereinafter, redundant descriptions of the memory device 141b in view of those of FIG. 2 will be omitted.

Referring to FIG. 8, the memory device 141b may include a ZQ calibration circuit 210 connected to the ZQ pad 1411, the code conversion circuit 820 and a DQ driver circuit 230 connected to the DQ pad 1412.

The ZQ calibration circuit 210 may generate the ZQ code ZQ[n–1:0] of n bits converged by repeatedly performing a calibration operation using the external resistor RZQ connected to the ZQ pad 1411.

The code conversion circuit 820 may convert the ZQ code ZQ[n–1:0] of n bits output from the ZQ calibration circuit 210 into the coupled ZQ code ZQ[n–1:0],[HLSB] of n+1 bits, obtain an average value of k number of coupled ZQ codes ZQ[n–1:0],[HLSB], and output the average value of the k number of coupled ZQ codes [n–1:0],[HLSB] as the DQ code DQ[n–1:0], [HLSB]. The code conversion circuit 820 may couple the ZQ code ZQ[n–1:0] of 0 bit with the 0th ZQ code ZQ[HLSB] to generate the coupled ZQ code ZQ[n–1:0],[HLSB] and set the ZQ code [HLSB] to a '0' bit.

The DQ driver circuit 230 may determine a termination resistance value of the DQ pad 1412 based on the DQ code DQ[n–1:0],[HLSB] of n+1 bits.

Figure 9:
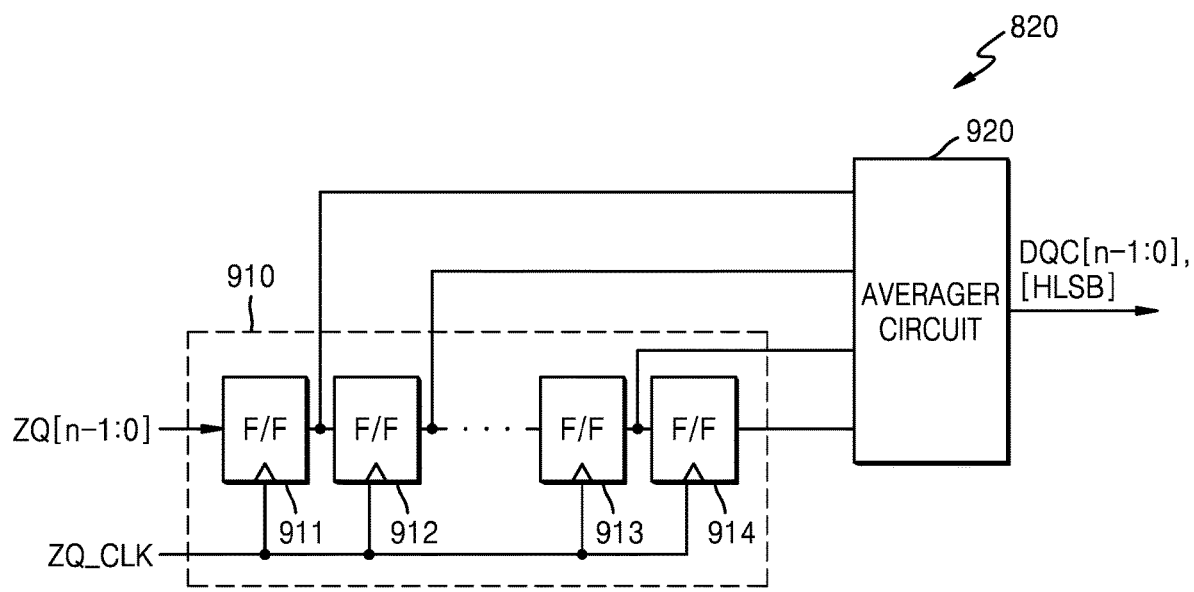
FIG. 9 is a circuit diagram illustrating a code conversion circuit of FIG. 8.

FIG. 9 is a circuit diagram illustrating the code conversion circuit 820 of FIG. 8.

Referring to FIG. 9, the code conversion circuit 820 may receive and convert the ZQ code ZQ[n–1:0] of n bits into the DQ code DQC[n–1:0],[HLSB] of n+1 bits. The code conversion circuit 820 may include a flip-flop circuit 910 and an averager circuit 920.

The flip-flop circuit 910 may receive, latch, and output k (k is a natural number) ZQ codes [n–1:0] in response to a clock signal ZQ_CLK. The flip-flop circuit 910 may include k flip-flops 911, 912, . . . 913, and 914 connected in series, and store the ZQ code [n–1:0] of n bits in each of the flip-flops 911, 912, . . . 913, and 914.

The averager circuit 920 may convert each of the k ZQ codes [n–1:0] output from the flip-flop circuit 910 into a coupled ZQ code [n–1:0],[HLSB], average the k coupled ZQ codes [n–1:0],[HLSB] and generate a DQ code DQ[n–1:0],[HLSB] based on the average. The averager circuit 920 may shift the k coupled ZQ codes [n–1:0],[HLSB] by one code and obtain an average value of neighboring coupled ZQ codes. For example, the averager circuit 920 may obtain a first average value of first and second coupled ZQ codes in a first clock cycle of the clock signal ZQ_CLK, and then obtain a second average value of the first average value and a third coupled ZQ code in a second clock cycle. As described above, the averager circuit 920 may average the k coupled ZQ codes [n–1:0],[HLSB], and output an average value of the k coupled ZQ codes [n–1:0],[HLSB] as the DQ code DQ[n–1:0],[HLSB].

FIG. 10 is a chart illustrating a high resolution ZQ calibration method according to example embodiments of the disclosure.

Referring to FIG. 10 in connection with FIGS. 8 and 9, as a result of comparing a voltage level of the ZQ pad 1411 to the reference voltage VREFQ level in the ZQ calibration circuit 210, it is assumed that the ZQ code ZQ[3:0] of 4 bits is generated, and four ZQ codes among the generated k ZQ codes [3:0] are shown. In the ZQ calibration circuit 210, it is assumed that k-3th to kth ZQ codes [3:0] [1011], [1100], [1011], and [1010] are sequentially output during four clock cycles of the clock signal ZQ_CLK.

The code conversion circuit 820 may convert each of four ZQ codes [3:0] [1011], [1100], [1011], and [1010] into a coupled ZQ code ZQ[3:0],[HLSB] of 5 bits, average the four coupled ZQ codes [3:0],[HLSB], and output an average value of the four coupled ZQ codes [3:0],[HLSB] as a DQ code DQ[3:0], [HLSB], which is [10110].

Figure 11:
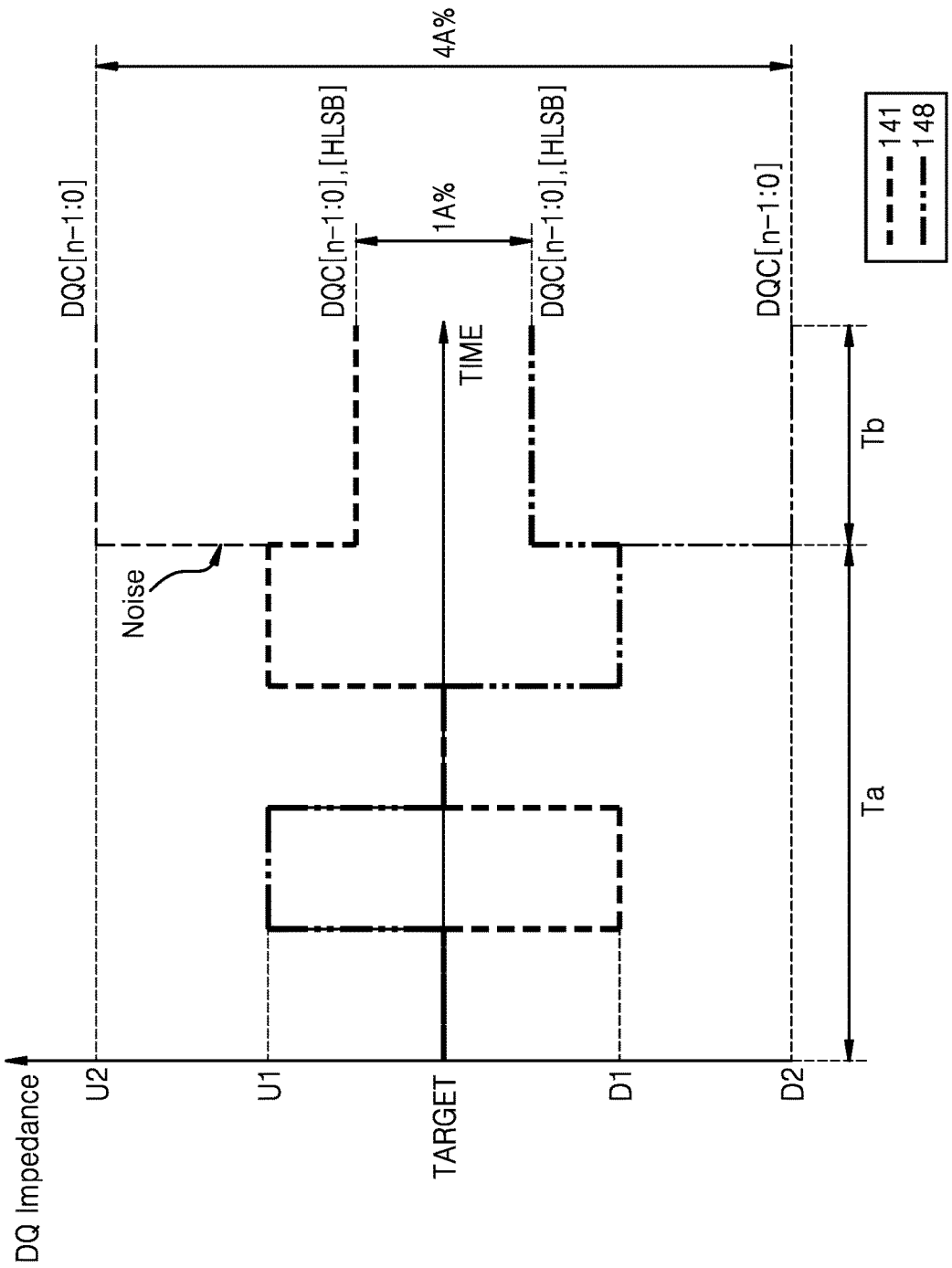
FIG. 11 is a diagram illustrating a method of changing a DC code in a high resolution ZQ calibration method according to example embodiments of the disclosure.

FIG. 11 is a chart illustrating a method of changing a DC code in a high resolution ZQ calibration method according to example embodiments of the disclosure.

Referring to FIGS. 1 and 8 to 11, in each of the first and eighth memory devices 141 and 148 of the multi-chip package 100, termination impedances of the DQ pads 1412 and 1418 are obtained as a result of a high resolution ZQ calibration operation, which includes converting the ZQ code ZQ[n−1:0] of n bits into a coupled ZQ code ZQ[n−1:0],[HLSB] of n+1 bits, averaging the k coupled ZQ codes ZQ[n−1:0],[HLSB], and outputting an average value of the k coupled ZQ codes ZQ[n−1:0],[HLSB] as the DQ code DQ[n−1:0],[HLSB]. Referring to FIG. 11, it is shown that the termination impedances of the DQ pads 1412 and 1418 may be reduced from a change rate of about 4A % to about 1A %. Compared to FIG. 7, in which the termination impedances of the DQ pads 1412 and 1482 are reduced from the change rate of about 4A % to about 3A %, the example embodiments according to FIGS. 1 and 8-11 may further reduce the termination impedances of the DQ pads 1412 and 1482 to about 1A %. That is, the change rate of a termination resistance value of data transmitted to the DQ pads 1412 and 1482 of the first and eighth memory devices 141 and 148 of the multi-chip package 100 may be greatly reduced, and thus SI characteristic of the data may be further improved.

Figure 12:
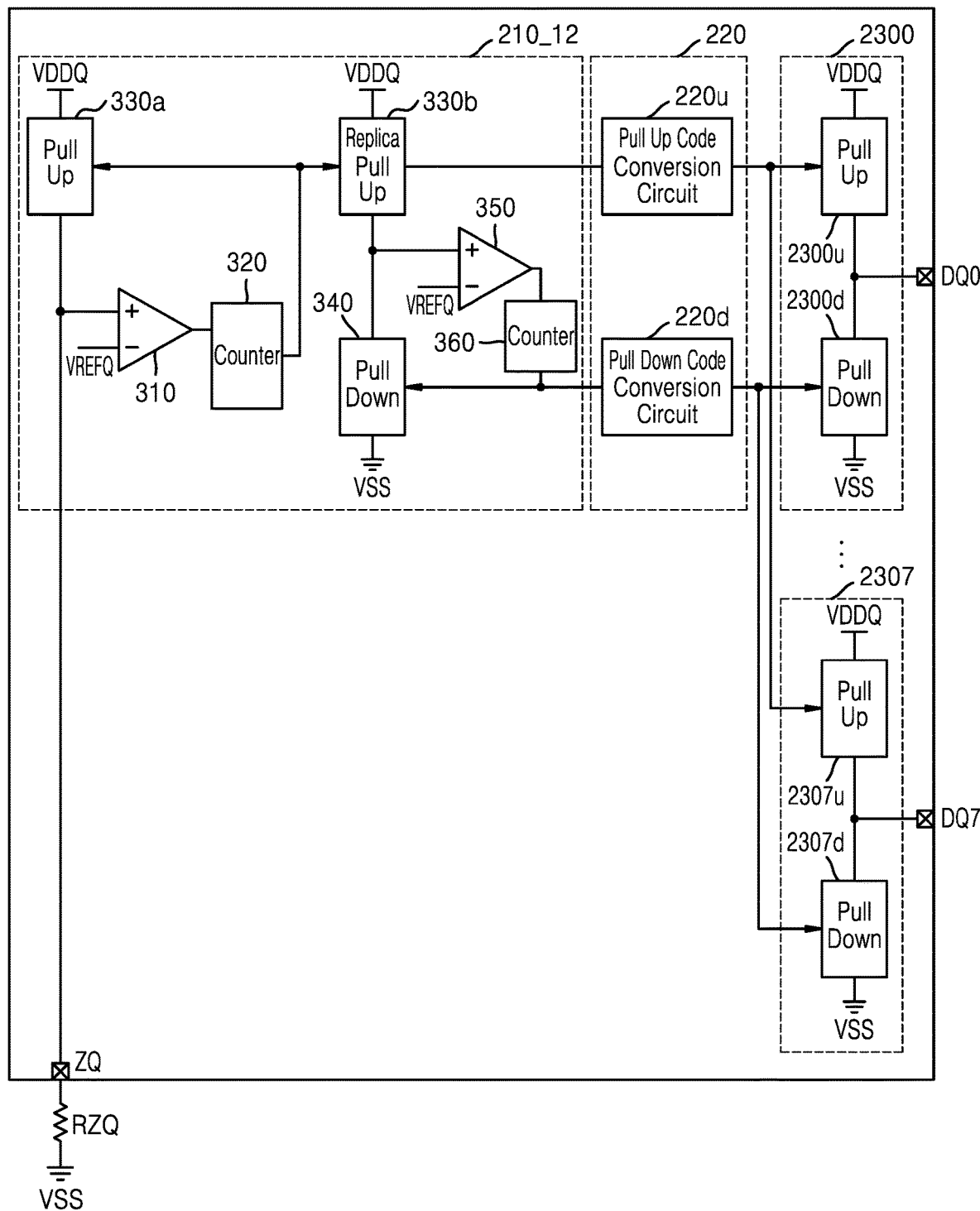
FIG. 12 is a block diagram illustrating memory devices of FIG. 1 according to example embodiments of the disclosure.

FIG. 12 is a block diagram illustrating the memory devices 141 to 148 of FIG. 1 according to example embodiments.

Referring to FIG. 12, the external resistor RZQ may be connected between the ZQ pad (e.g., a corresponding one of ZQ pads 1411, 1421, 1431, 1441, 1451, 1461, 1471, and 1481) and a ground voltage VSS. Each of the memory devices 141 to 148 may include a ZQ calibration circuit 210_12 connected to the ZQ pad, the code conversion circuit 220, and a corresponding one of DQ driver circuits 2300, . . . and 2307 respectively connected to DQ pads DQ0 to DQ7 and perform a high resolution ZQ calibration operation. For brevity of the drawing, the DQ driver circuit 2300 connected to the DQ pad DQ0 and the DQ driver circuit 2307 connected to the DQ pad DQ7 among the DQ pads DQ0 to DQ7 are shown. The same DQ driver circuit as the DQ driver circuits 2300 and 2307 may also be connected to the DQ pads DQ1 to DQ6. The DQ driver circuits 2300 and 2307 may respectively include pull-ups 2300u and 2307u and pull-downs 2300d and 2307d.

The ZQ calibration circuit 210_12 may perform a ZQ calibration operation of a corresponding memory chip. The ZQ calibration operation may include a pull-up calibration operation and a pull-down calibration operation. The ZQ calibration circuit 210_12 may include a first pull-up 330a, a first comparator 310, a first counter 320, a second pull-up 330b, a pull-down 340, a second comparator 350 and a second counter 360.

The first comparator 310 may compare a voltage of the ZQ pad and the reference voltage VREFQ. An output of the first comparator 310 may be provided to the first counter 320 to control a counting operation of the first counter 320. The first pull-up 330a may perform the pull-up calibration operation based on the output of the first counter 320. The first pull-up 330a generates a pull-up ZQ code based on the outputs of the first comparator 310 and the first counter 320, and may perform the pull-up calibration operation while changing the pull-up ZQ code until the voltage of the ZQ pad and the reference voltage VREFQ are equal. The first pull-up 330a may provide a pull-up ZQ code of n bits at the time when the voltage of the ZQ pad and the reference voltage VREFQ are equal, to the second pull-up 330b and the code conversion circuit 220.

The second pull-up 330b may have substantially the same configuration as the first pull-up 330a. An impedance of the second pull-up 330b may be adjusted by the pull-up ZQ code. Accordingly, the impedance of the second pull-up 330b may be substantially the same as the impedance of the first pull-up 330a. The second comparator 350 may compare a voltage of a connection node between the second pull-up 330b and the pull-down 340 and the reference voltage VREFQ. The output of the second comparator 350 may be provided to the second counter 360 to control a counting operation of the second counter 360. The pull-down 340 may perform the pull-down calibration operation based on the output of the second counter 360. The pull-down 340 generates a pull-down ZQ code based on the outputs of the second comparator 350 and the second counter 360, and may perform the pull-down calibration operation while changing the pull-down ZQ code until the voltage of the connection node between the second pull-up 330b and the pull-down 340 and the reference voltage VREFQ are equal. The pull-down 340 may provide a pull-down ZQ code of n bits at the time when the voltage of the connection node between the second pull-up 330b and the pull-down 340 and the reference voltage VREFQ are equal, to the code conversion circuit 220.

The code conversion circuit 220 may include a pull-up code conversion circuit 220u and a pull-down code conversion circuit 220d. The pull-up code conversion circuit 220u may convert the pull-up ZQ code of n bits into a pull-up DQ code of n+1 bits. A hidden LSB may be included in the pull-up DQ code of n+1 bits. The pull-up DQ code of n+1 bits may be provided to the pull-ups 2300u and 2307u of the DQ driver circuits 2300 and 2307, respectively.

The pull-down code conversion circuit 220d may convert the pull-down ZQ code of n bits into a pull-down DQ code of n+1 bits. A hidden LSB may be included in the pull-down DQ code of n+1 bits. The pull-down DQ code of n+1 bits may be provided to the pull-downs 2300d and 2307d of the DQ driver circuits 2300 and 2307, respectively.

The pull-ups 2300u and 2307u and the pull-downs 2300d and 2307d of the DQ driver circuits 2300 and 2307 may respectively adjust termination resistance values of DQ pads DQ0 and DQ7 using the pull-up DQ code of n+1 bits and the pull-down DQ code of n+1 bits. In the pull-ups 2300u and 2307u, a size of a first PMOS transistor to which the hidden LSB of the pull-up DQ code is input and a resistance value of a first resistor connected to the first PMOS transistor may be respectively set to about 0.5 or less of a size (or less) of a second PMOS transistor to which the LSB of the pull-up DQ code is input and a resistance value of a second resistor connected to the second PMOS transistor. In the pull-downs 2300d and 2307d, a size of a first NMOS transistor to which the hidden LSB of the pull-down DQ code is input and a resistance value of the first resistor connected to the first NMOS transistor may be respectively set to about 0.5 or less of a size of a second NMOS transistor to which the LSB of the pull-up DQ code is input and a resistance value of a second resistor connected to the second NMOS transistor.

Each of the memory devices 141 to 148 may improve SI characteristics of data by reducing a change rate of the termination resistance values of the DQ pads DQ0 to DQ7 as a result of such a high resolution ZQ calibration operation.

Figure 13:
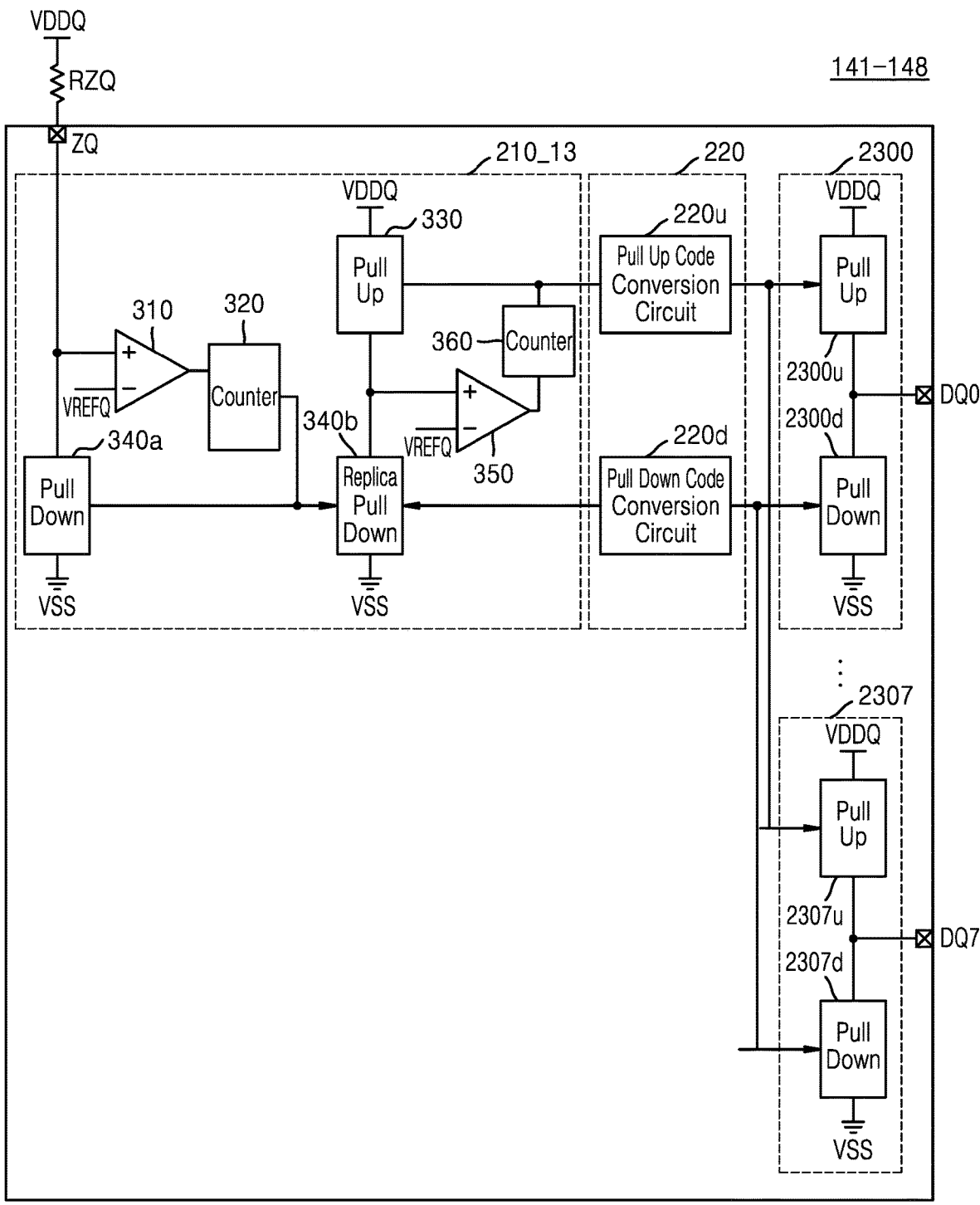
FIG. 13 is a block diagram illustrating memory devices of FIG. 1 according to example embodiments of the disclosure.

FIG. 13 is a block diagram illustrating the memory devices 141 to 148 of FIG. 1 according to example embodiments.

Referring to FIG. 13, the external resistor RZQ may be connected between the ZQ pad and the power voltage VDDQ. Each of the memory devices 141 to 148 is different from FIG. 12 in that a ZQ calibration circuit 210_13 that performs a pull-up calibration operation and a pull-down calibration operation includes a first pull-down 340a, a second pull-down 340b and a pull-up 330 respectively instead of the first pull-up 330a, the second pull-up 330b and the pull-down 340. Hereinafter, descriptions of the memory devices 141 to 148 that are redundant with those of FIG. 12 will be omitted.

The first comparator 310 may control a counting operation of the first counter 320 by comparing a voltage of the ZQ pad with the reference voltage VREFQ. The first pull-down 340a may generate a pull-down ZQ code by performing a pull-down calibration operation based on an output of the first counter 320. The first pull-down 340a may provide the pull-down ZQ code of n bits at a time when the voltage of the ZQ pad and the reference voltage VREFQ are equal, to the second pull-down 340b and the code conversion circuit 220.

The second pull-down 340b may have substantially the same configuration as the first pull-down 340a. An impedance of the second pull-down 340b may be adjusted by the pull-down ZQ code. Accordingly, the impedance of the second pull-down 340b may be substantially the same as the impedance of the first pull-down 340a. The second comparator 350 may compare a voltage of a connection node between the second pull-down 340b and the pull-up 330 with the reference voltage VREFQ. An output of the second comparator 350 may be provided to the second counter 360 to control a counting operation of the second counter 360. The pull-up 330 may generate a pull-up ZQ code by performing a pull-up calibration operation based on the output of the second counter 360. The pull-up 330 may perform the pull-up calibration operation while changing the pull-up ZQ code until the voltage of the connection node between the second pull-down 340b and the pull-up 330 and the reference voltage VREFQ are equal. The pull-down 340 may provide a pull-up ZQ code of n bits at the time when a pull-up ZQ code of n bits at a time when the voltage of the connection node between the second pull-down 340b and the pull-up 330 and the reference voltage VREFQ are equal.

The code conversion circuit 220 may convert the pull-up ZQ code of n bits into a pull-up DQ code of n+1 bits, and convert the pull-down ZQ code of n bits into a pull-down DQ code of n+1 bits. The pull-ups 2300u and 2307u and the pull-downs 2300d and 2307d of the DQ driver circuits 2300 and 2307 may respectively adjust termination resistance values of the DQ pads DQ0 and DQ7 using the pull-up DQ code of n+1 bits and the pull-down DQ code of n+1 bits. Each of the memory devices 141 to 148 may improve SI characteristics of data by reducing a change rate of the termination resistance values of the DQ pads DQ0 to DQ7 as a result of such a high resolution ZQ calibration operation.

Figure 14:
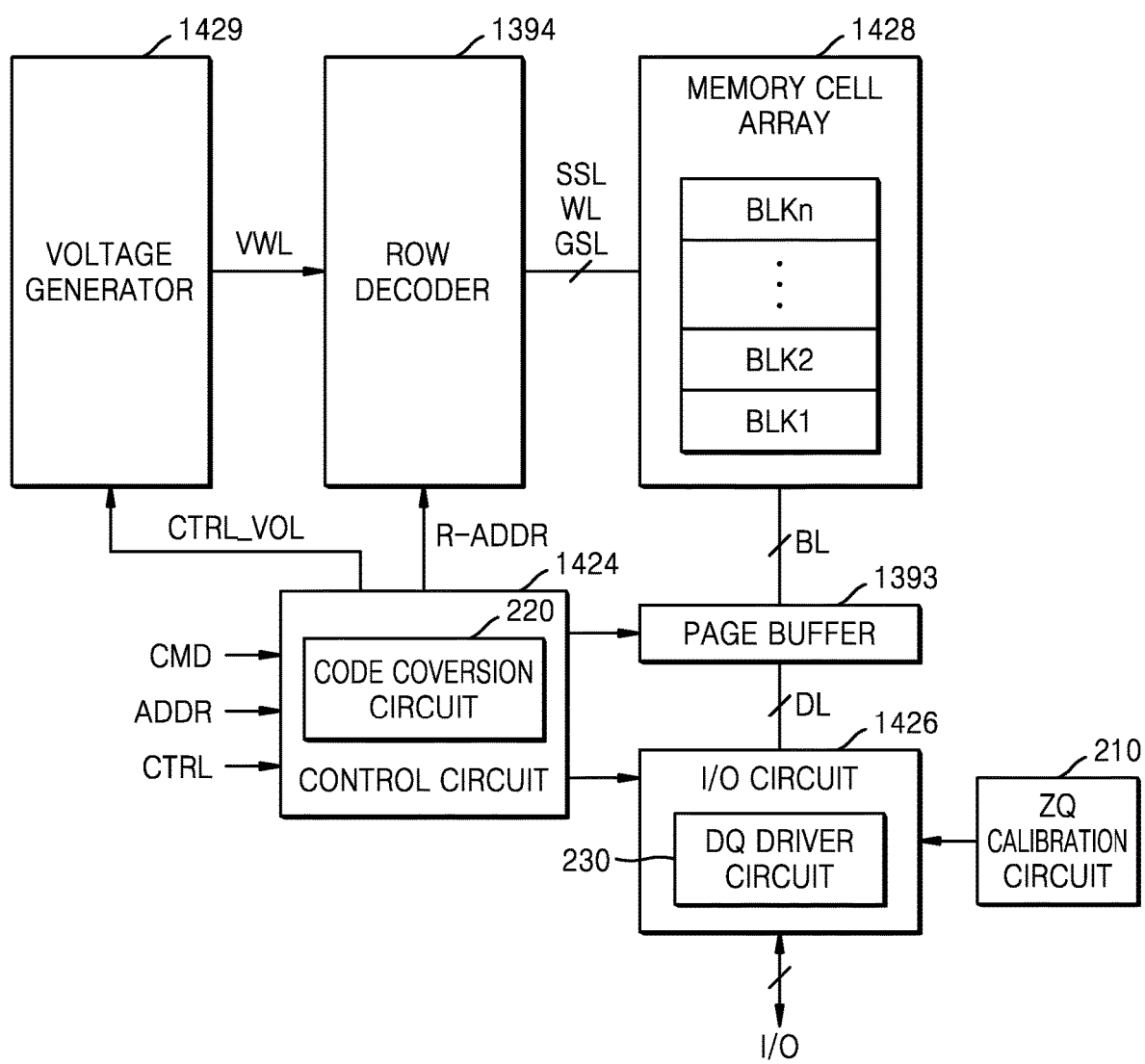
FIG. 14 is a block diagram illustrating a memory devices of FIG. 1 according to example embodiments of the disclosure.

FIG. 14 is a block diagram illustrating the memory devices 141 to 148 of FIG. 1 according to example embodiments.

Referring to FIG. 14, each of the memory devices 141 to 148 may include the ZQ calibration circuit 210, a memory cell array 1428, a row decoder 1394, a control circuit 1424, a page buffer 1393, an input/output circuit 1426 and a voltage generator 1429. Although not shown, the memory devices 141 to 148 may further include an input/output interface.

The ZQ calibration circuit 210 may generate a ZQ code of n bits converged by repeatedly performing a calibration operation using the external resistor RZQ connected to the ZQ pads 1411, 1421, 1431, 1441, 1451, 1461, 1471, and 1481.

The memory cell array 1428 may be connected to word lines WL, string select lines SSL, ground select lines GSL, and bit lines BL. The memory cell array 1428 may be connected to the row decoder 1394 through the word lines WL, the string select lines SSL, and the ground select lines GSL, and may be connected to the page buffer 1393 through the bit lines BL. The memory cell array 1428 may include a plurality of memory blocks BLK1 to BLKn.

The row decoder 1394 may select one of the plurality of memory blocks BLK1 to BLKn of the memory cell array 1428, select one of the word lines WL of the selected memory block, and select one of the plurality of string select lines SSL.

The control circuit 1424 may output various internal control signals for performing program, read, and erase operations on the memory cell array 1428 based on a command CMD, an address ADDR, and a control signal CTRL transmitted from a controller. The control circuit 1424 may provide a row address R_ADDR to the row decoder 1394, provide a column address to the input/output circuit 1426, and provide a voltage control signal CTRL_VOL to the voltage generator 1427. The control circuit 1424 may include the code conversion circuit 220 configured to convert a ZQ code of n bits into a DQ code of n+1 bits in order to perform a high resolution ZQ calibration operation of the memory devices 141 to 148.

The page buffer 1393 may operate as a write driver or a sense amplifier according to an operation mode. During a read operation, the page buffer 1393 may sense the bit line BL of a selected memory cell under the control of the control circuit 1424. The sensed data may be stored in a latch provided in the page buffer 1393. The page buffer 1393 may dump the data stored in the latch to the input/output circuit 1426 through a data line DL under the control of the control circuit 1424.

The input/output circuit unit 1426 may temporarily store a command CMD, an address ADDR, and data provided from the outside of the memory devices 141 to 148 through the input/output line I/O. The input/output circuit 1426 may temporarily store read data of the memory devices 141 to 148 and output the data to the outside through an input/output line I/O at a designated time. The input/output circuit 1426 may include the DQ driver circuit 230 that determines a termination resistance value of data based on the DQ code of n+1 bits.

The voltage generator 1429 may generate various types of voltages for performing the program, read, and erase operations on the memory cell array 1428 based on a voltage control signal CTRL_VOL. Specifically, the voltage generator 1429 may generate a word line voltage VWL, for example, a program voltage, a detection read voltage, a read voltage, a pass voltage, an erase voltage, an erase verification voltage, etc.

Figure 15:
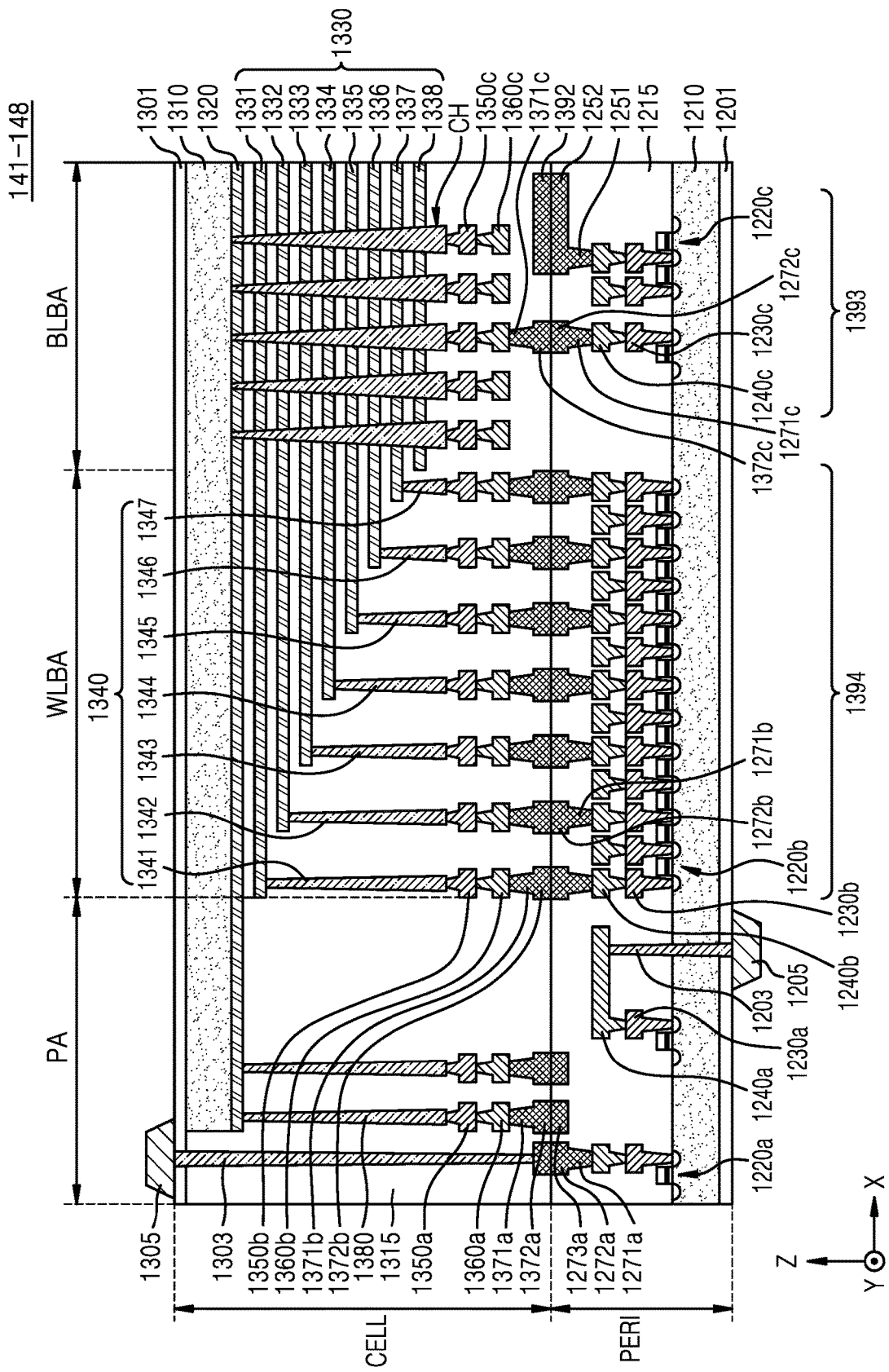
FIG. 15 is a diagram illustrating a memory device of FIG. 1 according to example embodiments of the disclosure.

FIG. 15 is a diagram illustrating a memory device 141 of FIG. 1 according to an example embodiment.

Referring to FIG. 15, a memory device 141 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may include aluminum (Al) or tungsten (W).

Each of the peripheral circuit region PERI and the cell region CELL of the memory device 141 may include an external pad bonding area PA, a word line bonding area WLBA, and a bit line bonding area BLBA.

The peripheral circuit region PERI may include a first substrate 1210, an interlayer insulating layer 1215, a plurality of circuit elements 1220a, 1220b, and 1220c on the first substrate 1210, first metal layers 1230a, 1230b, and 1230c respectively connected to the plurality of circuit elements 1220a, 1220b, and 1220c, and second metal layers 1240a, 1240b, and 1240c respectively on the first metal layers 1230a, 1230b, and 1230c. In an example embodiment, the first metal layers 1230a, 1230b, and 1230c may include tungsten having relatively high electrical resistivity, and the second metal layers 1240a, 1240b, and 1240c may include copper having relatively low electrical resistivity.

In an example embodiment illustrated in FIG. 15, although only the first metal layers 1230a, 1230b, and 1230c and the second metal layers 1240a, 1240b, and 1240c are shown and described, the example embodiment is not limited thereto, and one or more additional metal layers may be further provided on the second metal layers 1240a, 1240b, and 1240c. At least a portion of the one or more additional metal layers provided on the second metal layers 1240a, 1240b, and 1240c may include aluminum or the like having a lower electrical resistivity than those of copper included in the second metal layers 1240a, 1240b, and 1240c.

The interlayer insulating layer 1215 may be disposed on the first substrate 1210 and cover the plurality of circuit elements 1220a, 1220b, and 1220c, the first metal layers 1230a, 1230b, and 1230c, and the second metal layers 1240a, 1240b, and 1240c. The interlayer insulating layer 1215 may include an insulating material such as silicon oxide, silicon nitride, or the like.

Lower bonding metals 1271b and 1272b may be provided on the second metal layer 1240b in the word line bonding area WLBA. In the word line bonding area WLBA, the lower bonding metals 1271b and 1272b in the peripheral circuit region PERI may be electrically bonded to upper bonding metals 1371b and 1372b of the cell region CELL. The lower bonding metals 1271b and 1272b and the upper bonding metals 1371b and 1372b may include aluminum, copper, tungsten, or the like. Further, the upper bonding metals 1371b and 1372b in the cell region CELL may be referred as first metal pads and the lower bonding metals 1271b and 1272b in the peripheral circuit region PERI may be referred as second metal pads.

The cell region CELL may include at least one memory block. The cell region CELL may include a second substrate 1310 and a common source line 1320. On the second substrate 1310, a plurality of word lines 1331, 1332, 1333, 1334, 1335, 1336, 1337 and 1338 (collectively, 1330) may be stacked in a direction (a Z-axis direction), perpendicular to an upper surface of the second substrate 1310. At least one string select line and at least one ground select line may be arranged on or above and on or below the plurality of word lines 1330, respectively, and the plurality of word lines 1330 may be disposed between the at least one string select line and the at least one ground select line.

In the bit line bonding area BLBA, a channel structure CH may extend in a direction (a Z-axis direction), perpendicular to the upper surface of the second substrate 1310, and pass through the plurality of word lines 1330, the at least one string select line, and the at least one ground select line. The channel structure CH may include a data storage layer, a channel layer, a buried insulating layer, and the like, and the channel layer may be electrically connected to a first metal layer 1350c and a second metal layer 1360c. For example, the first metal layer 1350c may be a bit line contact, and the second metal layer 1360c may be a bit line. In an example embodiment, the bit line 1360c may extend in a first direction (a Y-axis direction), parallel to the upper surface of the second substrate 1310.

In an example embodiment illustrated in FIG. 15, an area in which the channel structure CH, the bit line 1360c, and the like are disposed may be defined as the bit line bonding area BLBA. In the bit line bonding area BLBA, the bit line 1360c may be electrically connected to the circuit elements 1220c that provides a page buffer 1393 in the peripheral circuit region PERI. The bit line 1360c may be connected to upper bonding metals 1371c and 1372c in the cell region CELL, and the upper bonding metals 1371c and 1372c may be connected to lower bonding metals 1271c and 1272c that are connected to the circuit elements 1220c of the page buffer 1393.

In the word line bonding area WLBA, the plurality of word lines 1330 may extend in a second direction (an X-axis direction), parallel to the upper surface of the second substrate 1310 and perpendicular to the first direction, and may be connected to a plurality of cell contact plugs 1341, 1342, 1343, 1344, 1345, 1346, and 1347 (collectively, 1340). The plurality of word lines 1330 and the plurality of cell contact plugs 1340 may be connected to each other in pads provided by at least a portion of the plurality of word lines 1330 extending in different lengths in the second direction. A first metal layer 1350b and a second metal layer 1360b may be sequentially connected to an upper portion of the plurality of cell contact plugs 1340 that are connected to the plurality of word lines 1330. The plurality of cell contact plugs 1340 may be connected to the peripheral circuit region PERI via the upper bonding metals 1371b and 1372b of the cell region CELL and the lower bonding metals 1271b and 1272b of the peripheral circuit region PERI in the word line bonding area WLBA.

The plurality of cell contact plugs 1340 may be electrically connected to the circuit elements 1220b that provides a row decoder 1394 in the peripheral circuit region PERI. In an example embodiment, operating voltages of the circuit elements 1220b of the row decoder 1394 may be different than operating voltages of the circuit elements 1220c that provides the page buffer 1393. For example, operating voltages of the circuit elements 1220c that provides the page buffer 1393 may be greater than operating voltages of the circuit elements 1220b that provides the row decoder 1394.

A common source line contact plug 1380 may be disposed in the external pad bonding area PA. The common source line contact plug 1380 may include a conductive material such as a metal, a metal compound, polysilicon, or the like, and may be electrically connected to the common source line 1320. A first metal layer 1350a and a second metal layer 1360a may be sequentially stacked on an upper portion of the common source line contact plug 1380. For example, an area in which the common source line contact plug 1380, the first metal layer 1350a, and the second metal layer 1360a are disposed may be defined as the external pad bonding area PA.

Input-output pads 1205 and 1305 may be disposed in the external pad bonding area PA. Referring to FIG. 15, a lower insulating film 1201 covering a lower surface of the first substrate 1210 may be formed below the first substrate 1210, and a first input-output pad 1205 may be formed on the lower insulating film 1201. The first input-output pad 1205 may be connected to at least one of the plurality of circuit elements 1220a, 1220b, and 1220c disposed in the peripheral circuit region PERI through a first input-output contact plug 1203, and may be separated from the first substrate 1210 by the lower insulating film 1201. In addition, a side insulating film may be disposed between the first input-output contact plug 1203 and the first substrate 1210 to electrically separate the first input-output contact plug 1203 and the first substrate 1210.

Referring to FIG. 15, an upper insulating film 1301 covering the upper surface of the second substrate 1310 may be formed on the second substrate 1310, and a second input-output pad 1305 may be disposed on the upper insulating layer 1301. The second input-output pad 1305 may be connected to at least one of the plurality of circuit elements 1220a, 1220b, and 1220c disposed in the peripheral circuit region PERI through a second input-output contact plug 1303. In the example embodiment, the second input-output pad 1305 is electrically connected to a circuit element 1220a.

According to example embodiments, the second substrate 1310 and the common source line 1320 may not be disposed in an area in which the second input-output contact plug 1303 is disposed. Also, the second input-output pad 1305 may not overlap the word lines 1330 in the third direction (the Z-axis direction). Referring to FIG. 15, the second input-output contact plug 1303 may be separated from the second substrate 1310 in a direction, parallel to the upper surface of the second substrate 1310, and may pass through the interlayer insulating layer 1315 of the cell region CELL to be connected to the second input-output pad 1305.

According to example embodiments, the first input-output pad 1205 and the second input-output pad 1305 may be selectively formed. For example, the memory device 141 may include only the first input-output pad 1205 disposed on the first substrate 1210 or the second input-output pad 1305 disposed on the second substrate 1310. Alternatively, the memory device 141 may include both the first input-output pad 1205 and the second input-output pad 1305.

A metal pattern provided on an uppermost metal layer may be provided as a dummy pattern or the uppermost metal layer may be absent, in each of the external pad bonding area PA and the bit line bonding area BLBA, that are included in the cell region CELL and the peripheral circuit region PERI.

In the external pad bonding area PA, the memory device 141 may include a lower metal pattern 1273a, corresponding to an upper metal pattern 1372a formed in an uppermost metal layer of the cell region CELL, and having the same cross-sectional shape as the upper metal pattern 1372a of the cell region CELL so as to be connected to each other, in an uppermost metal layer of the peripheral circuit region PERI. In the peripheral circuit region PERI, the lower metal pattern 1273a formed in the uppermost metal layer of the peripheral circuit region PERI may not be connected to a contact. Similarly, in the external pad bonding area PA, the upper metal pattern 1372a, corresponding to the lower metal pattern 1273a formed in an uppermost metal layer of the peripheral circuit region PERI, and having the same shape as a lower metal pattern 1273a of the peripheral circuit region PERI, may be formed in the uppermost metal layer of the cell region CELL.

The lower bonding metals 1271b and 1272b may be formed on the second metal layer 1240b in the word line bonding area WLBA. In the word line bonding area WLBA, the lower bonding metals 1271b and 1272b of the peripheral circuit region PERI may be electrically connected to the upper bonding metals 1371b and 1372b of the cell region CELL by, for example, a Cu-to-Cu bonding.

Further, in the bit line bonding area BLBA, an upper metal pattern 1392, corresponding to a lower metal pattern 1252 formed in the uppermost metal layer of the peripheral circuit region PERI, and having the same cross-sectional shape as the lower metal pattern 1252 of the peripheral circuit region PERI, may be formed in the uppermost metal layer of the cell region CELL. A contact may not be formed on the upper metal pattern 1392 formed in the uppermost metal layer of the cell region CELL.

In an example embodiment, corresponding to a first metal pattern formed in an uppermost metal layer in one of the cell region CELL and the peripheral circuit region PERI, a reinforcement metal pattern having the same cross-sectional shape as the first metal pattern may be formed in an uppermost metal layer in the other one of the cell region CELL and the peripheral circuit region PERI. A contact may not be formed on the reinforcement metal pattern.

Figure 16:
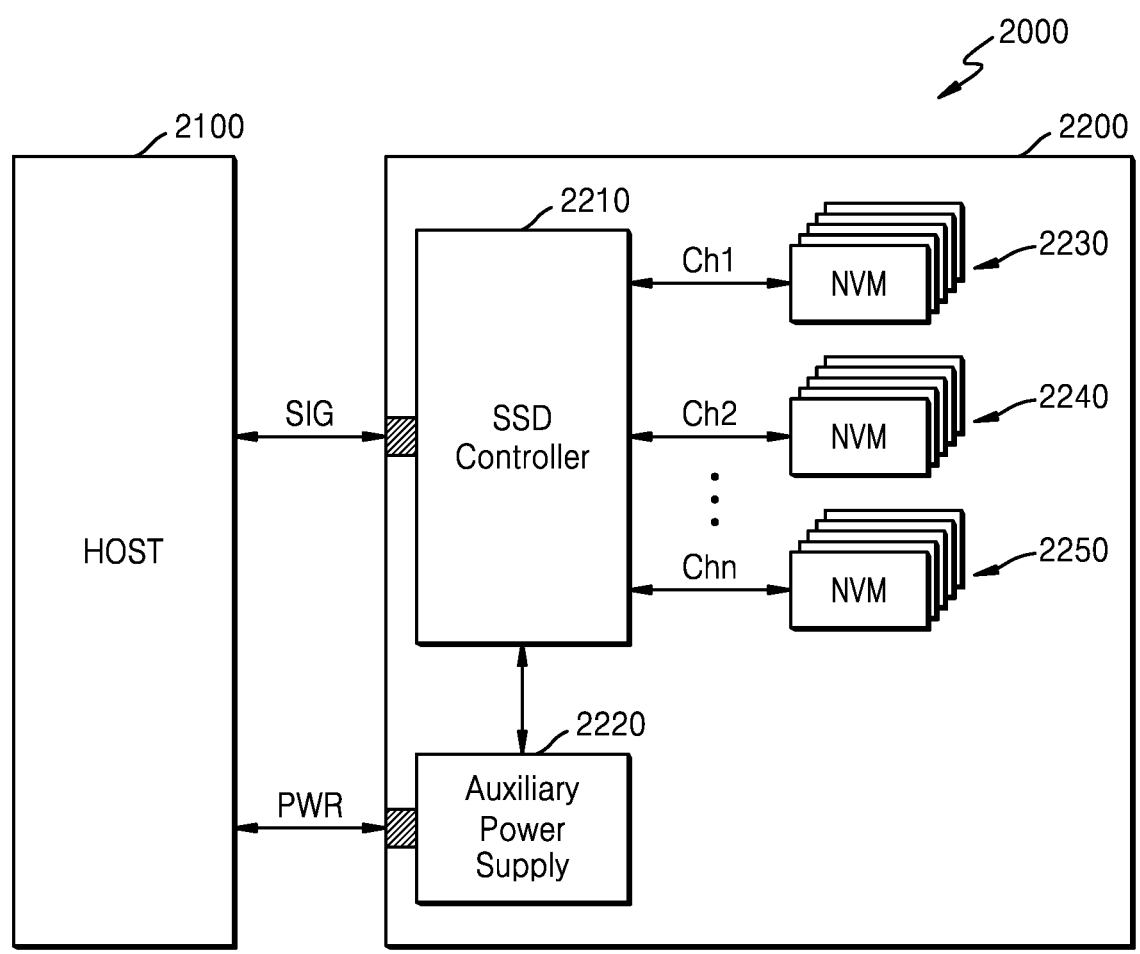
FIG. 16 is a block diagram illustrating an example in which a memory device according to example embodiments of the disclosure is applied to a solid state drive (SSD) system.

FIG. 16 is a block diagram illustrating an example in which a memory device according to example embodiments of the disclosure is applied to an SSD system 2000.

Referring to FIG. 16, the SSD system 2000 may include a host 2100 and an SSD 2200. The SSD 2200 exchanges a signal SIG with the host 2100 through a signal connector, and receives power through a power connector PWR. The SSD 2200 may include an SSD controller 2210, an auxiliary power supply 2220, and memory devices 2230, 2240, and 2250. The memory devices 2230, 2240, and 2250 may be vertically stacked NAND flash memory devices. In this regard, the SSD 2200 may be implemented using the example embodiments described above with reference to FIGS. 1 to 15.

While the disclosure has been particularly shown and described with reference to example embodiments thereof, it will be understood that various changes in form and details may be made therein without departing from the spirit and scope of the following claims.

What is claimed is:

1. An impedance adjustment (ZQ) calibration method comprising:
   performing a ZQ calibration operation of a ZQ pad, to which a ZQ resistor is electrically connected, to generate a ZQ code of n (n being a natural number) bits, the ZQ code comprising a first bit that is a least significant bit (LSB) through an n-th bit that is a most significant bit (MSB);
   converting the ZQ code of n bits into a data input/output (DQ) code of n+1 bits, by adding a 0-th hidden least significant bit (HLSB) to the ZQ code of n bits to generate a coupled ZQ code of n+1 bits and generating the DQ code of n+1 bits based on the coupled ZQ code, the DQ code comprising an MSB, an LSB, and HLSB; and controlling a termination resistance value of a DQ pad based on the DQ code.

2. The ZQ calibration method of claim 1, wherein the performing the ZQ calibration operation comprises:

comparing a voltage level of the ZQ pad with a reference voltage level and outputting a comparison signal;

increasing or decreasing a value of a counter based on the comparison signal; and generating the ZQ code based on the value of the counter.

3. The ZQ calibration method of claim 2, wherein the converting the ZQ code comprises:

adding a bit of '1' to an HLSB of the coupled ZQ code in response to a first logic level of the comparison signal; and outputting, as the DQ code, the coupled ZQ code obtained by adding the bit of '1' to the HLSB of the coupled ZQ code.

4. The ZQ calibration method of claim 2, wherein the converting the ZQ code comprises:

subtracting a bit of '1' from an HLSB of the coupled ZQ code in response to a second logic level of the comparison signal; and outputting, as the DQ code, the coupled ZQ code obtained by subtracting the bit of '1' from the HLSB of the coupled ZQ code.

5. The ZQ calibration method of claim 1, wherein the controlling the termination resistance value comprises:

setting a size of a first transistor to which the HLSB of the DQ code is input to be less than a size of a second transistor to which the LSB of the DQ code is input.

6. The ZQ calibration method of claim 5, wherein the controlling the termination resistance value further comprises:

setting a resistance value of a first resistor electrically connected to the first transistor to be less than a resistance value of a second resistor electrically connected to the second transistor.

7. The ZQ calibration method of claim 1, wherein the converting the ZQ code comprises:

receiving the ZQ code in response to a clock signal;

latching k (k being a natural number) ZQ codes during k clock cycles of the clock signal;

converting each of the k ZQ codes into the coupled ZQ code;

averaging k coupled ZQ codes; and outputting an average value of the k coupled ZQ codes as the DQ code.

8. The ZQ calibration method of claim 7, wherein the averaging the k coupled ZQ codes comprises:

shifting the k coupled ZQ codes by one code and obtaining an average value of neighboring coupled ZQ codes.

9. The ZQ calibration method of claim 7, wherein the controlling the termination resistance value comprises:

setting a size of a first transistor to which the HLSB of the DQ code is input to be less than a size of a second transistor to which the LSB of the DQ code is input.

10. A memory device comprising:

an impedance adjustment (ZQ) calibration circuit electrically connected to a ZQ pad and configured to perform a ZQ calibration operation using a ZQ resistor electrically connected to the ZQ pad and generate a ZQ code of n (n being a natural number) bits, the ZQ code comprising a first bit that is a least significant bit (LSB) through an n-th bit that is a most significant bit (MSB);

a code conversion circuit configured to convert the ZQ code of n bits into a data input/output (DQ) code of n+1 bits, by adding a 0-th hidden least significant bit (HLSB) to the ZQ code of n bits to generate a coupled ZQ code of n+1 bits, and generating the DQ code based on the coupled ZQ code, the DQ code comprising an MSB, an LSB, and an HLSB; and a DQ driver circuit configured to control a termination resistance value of a DQ pad based on the DQ code.

11. The memory device of claim 10, wherein the ZQ calibration circuit comprises:

a comparator configured to compare a voltage level of the ZQ pad with a reference voltage level and output a comparison signal;

a counter configured to increase or decrease a counter value based on the comparison signal and output the ZQ code of n bits based on the counter value; and a pull-up circuit electrically connected between a power voltage line and the ZQ pad, and comprising first transistors to which each bit of the ZQ code is input and first resistors respectively and electrically connected to the first transistors, wherein sizes of the first transistors and/or sizes of resistance values of the first resistors are set to different values according to a binary weight of the ZQ code.

12. The memory device of claim 11, wherein the ZQ resistor is electrically connected between the ZQ pad and a ground voltage line.

13. The memory device of claim 10, wherein the ZQ calibration circuit comprises:

a comparator configured to compare a voltage level of the ZQ pad with a reference voltage level and a comparison signal;

a counter configured to increase or decrease a counter value based on the comparison signal and output the ZQ code of n bits; and a pull-down circuit electrically connected between the ZQ pad and a ground voltage line, and comprising second transistors to which each bit of the ZQ code is input and second resistors respectively and electrically connected to the second transistors, wherein sizes of the second transistors and/or sizes resistance values of the second resistors are set to different values according to a binary weight of the ZQ code.

14. The memory device of claim 13, wherein the ZQ resistor is electrically connected between the ZQ pad and a power voltage line.

15. The memory device of claim 11, wherein the code conversion circuit comprises:

an adder configured to add a bit of '1' to an HLSB of the coupled ZQ code;

a subtractor configured to subtract the bit of '1' from the HLSB of the coupled ZQ code; and a selector configured to output, as the DQ code, the coupled ZQ code output from the adder or the subtractor in response to the comparison signal.

16. The memory device of claim 10, wherein the code conversion circuit comprises:

a flip-flop circuit configured to receive the ZQ code in response to a clock signal, and latch k (k being a natural number) ZQ codes during k clock cycles of the clock signal; and an averager circuit configured to average and output the k ZQ codes as the DQ code, convert each of the k ZQ codes into the coupled ZQ code, average k coupled ZQ codes; and output an average value of the k coupled ZQ codes as the DQ code.

17. The memory device of claim 16, wherein the averager circuit is further configured to shift the k coupled ZQ codes by one code and obtain an average value of neighboring coupled ZQ codes.

18. The memory device of claim 10, wherein the DQ driver circuit comprises:
    third transistors to which each bit of the DQ code is input and third resistors electrically connected to the third transistors, respectively,
    wherein the third transistors and the third resistors are electrically connected between a power voltage line and the DQ pad,
    wherein sizes of the third transistors and/or sizes of resistance values of the third resistors are set to different values according to a binary weight of the DQ code, and
    wherein a size of a third transistor to which the HLSB of the DQ code is input is set to be 0.5 or less than a size of a third transistor to which the LSB of the DQ code is input, and/or a size of a resistance value of a third resistor, electrically connected to the third transistor to which the HLSB of the DQ code is input, is set to be 0.5 or less than a size of a resistance value of a third resistor electrically connected to the third transistor to which the LSB of the DQ code is input.

19. The memory device of claim 10, wherein the DQ driver circuit comprises:
    fourth transistors to which each bit of the DQ code is input and fourth resistors electrically connected to the fourth transistors, respectively,
    wherein the fourth transistors and the fourth resistors are electrically connected between the DQ pad and a ground voltage line,
    wherein sizes of the fourth transistors and/or sizes of resistance values of the fourth resistors are set to different values according to a binary weight of the DQ code, and
    wherein a size of a fourth transistor to which the HLSB of the DQ code is input is set to be 0.5 or less than a size of a fourth transistor to which the LSB of the DQ code is input, and/or a size of a resistance value of a fourth resistor, electrically connected to the fourth transistor to which the HLSB of the DQ code is input, is set to be 0.5 or less than a size of a resistance value of a fourth resistor electrically connected to the fourth transistor to which the LSB of the DQ code is input.

20. A multi-chip package comprising:
    a printed circuit board; and
    a plurality of memory chips stacked on the printed circuit board and comprising an impedance adjustment (ZQ) pad and data input/output (DQ) pads,
    wherein each of the plurality of memory chips comprises:
    a ZQ calibration circuit electrically connected to the ZQ pad and configured to perform a ZQ calibration operation using a ZQ resistor outside the multi-chip package electrically connected to the ZQ pad and generate a ZQ code of n (n being a natural number) bits, the ZQ code comprising a first bit that is a least significant bit (LSB) through an n-th bit that is a most significant bit (MSB);
    a code conversion circuit configured to convert the ZQ code of n bits into a DQ code of n+1 bits, by adding a 0-th hidden least significant bit (HLSB) to the ZQ code of n bits to generate a coupled ZQ code of n+1 bits, and generating the DQ code based on the coupled ZQ code, the DQ code comprising an MSB, an LSB, and an HLSB; and
    a DQ driver circuit configured to control termination resistance values of the DQ pads based on the DQ code.

* * * * *